US010141342B2

(12) United States Patent
Takahashi

(10) Patent No.: US 10,141,342 B2
(45) Date of Patent: Nov. 27, 2018

(54) SEMICONDUCTOR DEVICE AND DISPLAY DEVICE

(71) Applicant: SEMICONDUCTOR ENERGY LABORATORY CO., LTD., Atsugi-shi, Kanagawa-ken (JP)

(72) Inventor: Kei Takahashi, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 14/862,171

(22) Filed: Sep. 23, 2015

(65) Prior Publication Data

US 2016/0093641 A1 Mar. 31, 2016

(30) Foreign Application Priority Data

Sep. 26, 2014 (JP) ................. 2014-196896

(51) Int. Cl.
H03M 1/12 (2006.01)
H01L 27/12 (2006.01)
G09G 3/3233 (2016.01)

(52) U.S. Cl.
CPC ....... *H01L 27/1225* (2013.01); *G09G 3/3233* (2013.01); *G09G 2320/0295* (2013.01); *G09G 2320/043* (2013.01)

(58) Field of Classification Search
CPC .......... H03M 1/00; H03M 1/005; H03M 1/46; H03M 1/56; H03M 2201/8132; H03M 3/30; H03M 3/38; H03M 3/384; H03M 3/454

(Continued)

(56) References Cited

U.S. PATENT DOCUMENTS 4,485,372 A * 11/1984 Holloway ............. H03M 1/124
324/99 D
5,731,856 A 3/1998 Kim et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

Primary Examiner — Linh Nguyen
(74) Attorney, Agent, or Firm — Nixon Peabody LLP; Jeffrey L. Costellia

(57) ABSTRACT

A semiconductor device capable of detecting a minute current with high accuracy is provided. The semiconductor device includes a first circuit, a second circuit, a first transistor, and a second transistor. A first analog signal is input to the first circuit via the first transistor. A second analog signal is input to the first circuit via the second transistor. The first analog signal includes a value of a first current. The second analog signal includes a value of a second current. The first circuit is capable of converting the first analog signal into a first digital signal. The second circuit is capable of generating a second digital signal based on the first digital signal. The first circuit is capable of converting the second analog signal into a third digital signal based on the second digital signal. The first or second transistor includes an oxide semiconductor in a channel.

13 Claims, 16 Drawing Sheets

(58) Field of Classification Search
USPC .................. 341/118–121, 141, 155, 172
See application file for complete search history.

(56) References Cited

U.S. PATENT DOCUMENTS

| | | | |
|---|---|---|---|
| 5,744,864 | A | 4/1998 | Cillessen et al. |
| 6,294,274 | B1 | 9/2001 | Kawazoe et al. |
| 6,323,798 | B1 * | 11/2001 | Abe ............... H03M 1/804 341/136 |
| 6,509,854 | B1 * | 1/2003 | Morita ............ H03M 1/685 341/143 |
| 6,563,174 | B2 | 5/2003 | Kawasaki et al. |
| 6,727,522 | B1 | 4/2004 | Kawasaki et al. |
| 6,903,670 | B1 * | 6/2005 | Lee ............... H03M 1/1038 341/118 |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,211,825 | B2 | 5/2007 | Shih et al. |
| 7,244,919 | B2 * | 7/2007 | Ishikawa ......... G01J 1/4228 250/208.1 |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,601,984 | B2 | 10/2009 | Sano et al. |
| 7,674,650 | B2 | 3/2010 | Akimoto et al. |
| 7,732,819 | B2 | 6/2010 | Akimoto et al. |
| 8,843,343 | B2 * | 9/2014 | Pahr ............... G01R 31/2829 702/116 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0048212 | A1 * | 3/2003 | Libove ............ H03K 17/04106 341/144 |
| 2003/0189401 | A1 | 10/2003 | Kido et al. |
| 2003/0218222 | A1 | 11/2003 | Wager, III et al. |
| 2003/0231142 | A1 * | 12/2003 | McKinzie, III ... H01Q 15/008 343/909 |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0057389 | A1 * | 3/2005 | Krymski ......... H03K 4/026 341/169 |
| 2005/0134542 | A1 * | 6/2005 | Iitsuka ............. G09G 3/3688 345/98 |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2009/0284692 | A1 * | 11/2009 | Yang ............... G02F 1/1336 349/95 |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0254986 | A1 * | 10/2011 | Nishimura ...... H01L 27/146 348/302 |
| 2013/0106631 | A1 * | 5/2013 | Petigny .......... H03M 1/1061 341/120 |
| 2013/0181854 | A1 * | 7/2013 | Koyama ......... G11C 27/026 341/122 |
| 2015/0317028 | A1 | 11/2015 | Takahashi et al. |
| 2015/0333746 | A1 * | 11/2015 | Danjo ............. H03K 5/249 327/63 |
| 2016/0071463 | A1 | 3/2016 | Takahashi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |

(56) References Cited

FOREIGN PATENT DOCUMENTS

| JP | 2004-273732 A | 9/2004 |
|---|---|---|
| JP | 2006-165529 A | 6/2006 |
| WO | WO-2004/114391 | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters) , Jun. 17, 1996, vol. 68, No. 25, pp. 3650-3652.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.
Park.S et al., "Challenge to Future Displays: Transparent AM-OLED Driven by PEALD Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

\* cited by examiner

Step 1
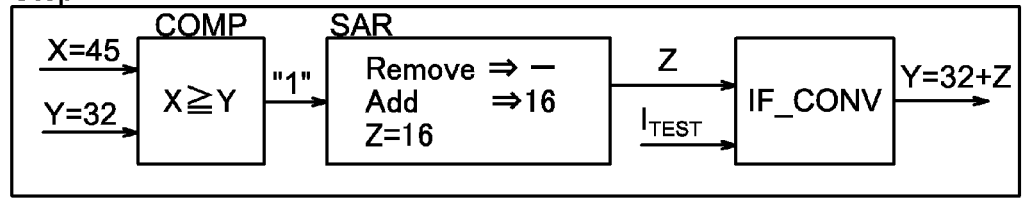
Step 2
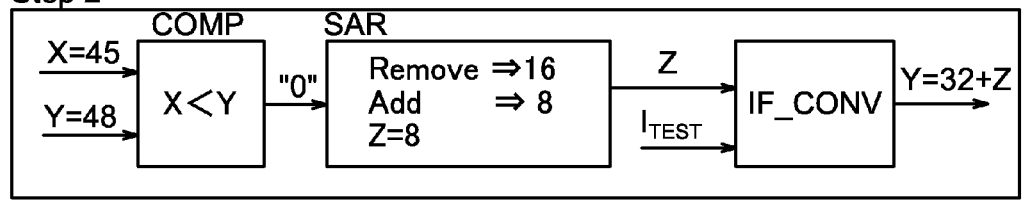
Step 3
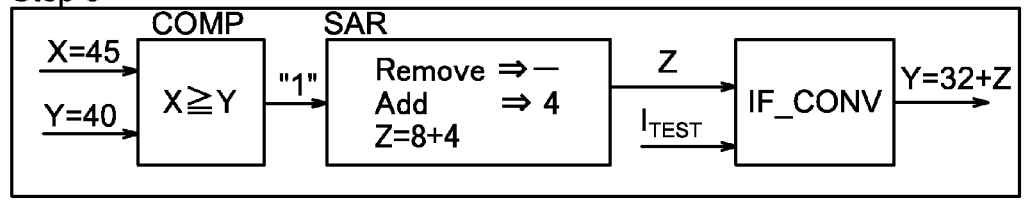
Step 4
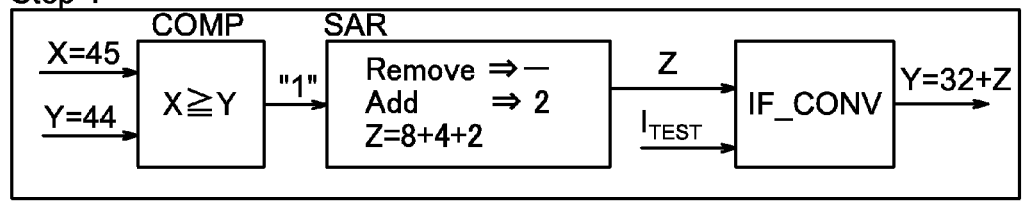
Step 5
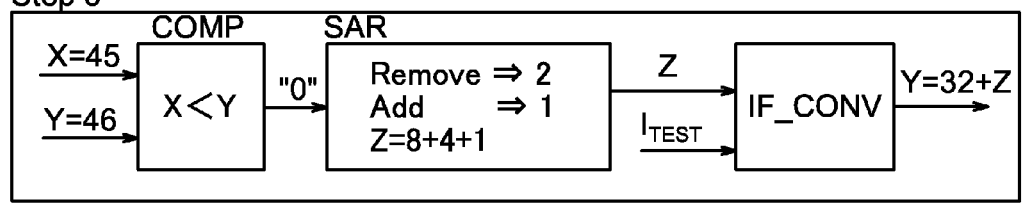
Step 6
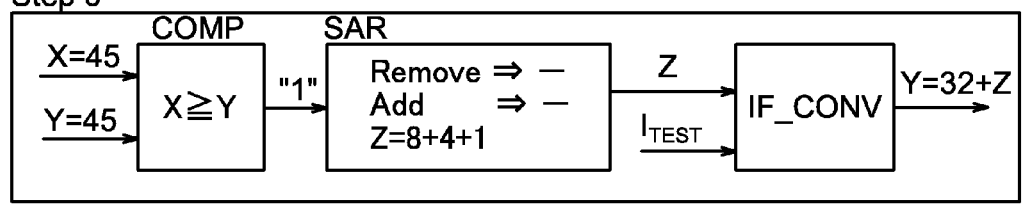
FIG. 5 monitor circuit 223

SEMICONDUCTOR DEVICE AND DISPLAY DEVICE

BACKGROUND OF THE INVENTION

1. Field of the Invention

One embodiment of the present invention relates to a semiconductor device, a display device, or an electronic device. Further, one embodiment of the present invention relates to, for example, a circuit, a processing circuit, or a memory circuit, which utilizes a semiconductor, a driving method thereof, a manufacturing method thereof, or the like.

2. Description of the Related Art

For pixels of an active matrix display device using light-emitting elements, a variety of circuit configurations have been proposed. In general, at least a light-emitting element, a transistor that controls input of a video signal to a pixel, and a transistor (driving transistor) that controls current supplied to the light-emitting element are provided in the pixel. Supplying a drain current flowing through the driving transistor to the light-emitting element enables the light-emitting element to emit light with a luminance corresponding to the value of the drain current. The drain current of the driving transistor is controlled by voltage of a video signal.

Therefore, in the case where electrical characteristics (e.g., threshold voltage, field-effect mobility) of the driving transistor vary among a plurality of pixels that constitute a screen of a display device, variations in luminance of the light-emitting element are generated even when video signals with the same voltage are supplied. Variations in electrical characteristics of the driving transistor among a plurality of pixels are one of the causes of reduction in display quality of a display device.

For active matrix display devices, the number of pixels to be provided has been increased to achieve higher resolution, and hundreds of thousands to tens of millions of pixels are provided in one display device. For example, the number of pixels is 1,049,088 (1,366×768×3 (RGB)) for the resolution of Full-HD, and is 33,177,600 (7,680×4,320×3 (RGB)) for the resolution of 8k4k (super high-vision). It is very difficult for driving transistors of a large number of different pixels to have perfectly the same electrical characteristics. Thus, measuring the electrical characteristics of a driving transistor and correcting the luminance of a light-emitting element is proposed (Patent Document 1, for example).

In order to meet demands for a larger number of gray levels and higher resolution of a display portion or the like, a dedicated IC (driver IC) is used in a driver circuit of a display device, particularly in a source driver circuit (see Patent Document 2, for example).

In a pixel circuit or a driver circuit of a display device, a transistor including a semiconductor thin film (also referred to as a field-effect transistor (FET) or a thin film transistor (TFT)) is often used. In recent years, an oxide semiconductor has been attracting attention as a semiconductor thin film that can be used for such transistors (Patent Document 3).

REFERENCE

[Patent Document 1] Japanese Published Patent Application No. 2009-265459
[Patent Document 2] Japanese Published Patent Application No. 2007-286525
[Patent Document 3] Japanese Published Patent Application No. 2007-123861

SUMMARY OF THE INVENTION

A circuit for measuring the electrical characteristics of a driving transistor in a pixel handles a signal with a current that flows in the pixel and is as low as 1 nA to several hundred nanoamperes. Therefore, in the case where the operation of the circuit is examined, the examination is preferably performed with such a small current signal.

Thus, an object of one embodiment of the present invention is to provide a semiconductor device capable of detecting a minute current with high accuracy. Another object of one embodiment of the present invention is to provide a semiconductor device capable of detecting a minute current with small power consumption. Another object of one embodiment of the present invention is to provide a novel semiconductor device or a method for a novel semiconductor device.

Note that the description of a plurality of objects does not mutually preclude the existence. One embodiment of the present invention does not necessarily achieve all the objects. Objects other than those listed above are apparent from the description of the specification, drawings, and claims, and also such objects could be an object of one embodiment of the present invention.

One embodiment of the present invention is a semiconductor device including a first circuit, a second circuit, a first transistor, and a second transistor. A first analog signal is input to the first circuit via the first transistor. A second analog signal is input to the first circuit via the second transistor. The first analog signal includes a value of a first current. The second analog signal includes a value of a second current. The first circuit is capable of converting the first analog signal into a first digital signal. The second circuit is capable of generating a second digital signal based on the first digital signal. The first circuit is capable of converting the second analog signal into a third digital signal based on the second digital signal. The first or second transistor comprises an oxide semiconductor in a channel formation region.

In the above embodiment, the second current is a current flowing in a pixel of a display device.

In the above embodiment, the first circuit preferably includes an integrator circuit, a comparator, and a counter.

In the above embodiment, the second circuit preferably includes a successive approximation register.

In the above embodiment, the oxide semiconductor preferably contains indium, zinc, and M (M is Al, Ga, Ge, Y, Zr, Sn, La, Ce, or Hf).

One embodiment of the present invention is an electronic device including a display device and the semiconductor device according to the above embodiment.

In this specification and the like, ordinal numbers such as first, second, and third are used to avoid confusion among components, and the terms do not limit the components numerically or do not limit the order.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are all semiconductor devices. Moreover, a memory device, a display device, a light-emitting device, a lighting device, an electronic device, and the like themselves might be semiconductor devices, or might each include a semiconductor device.

A transistor has three terminals: a gate, a source, and a drain. A gate is a node that controls the conduction state of a transistor. Depending on the channel type of the transistor or levels of potentials applied to the terminals, one of two input/output nodes functions as a source and the other functions as a drain. Therefore, the terms "source" and "drain" can be switched in this specification and the like. Further, in this specification and the like, the two terminals other than a gate may be referred to as a first terminal and a second terminal.

A node can be referred to as a terminal, a wiring, an electrode, a conductor, an impurity region, or the like in accordance with a circuit configuration, a device structure, and the like. Furthermore, a terminal and the like can be referred to as a node.

Voltage refers to a potential difference between a certain potential and a reference potential (e.g., a ground potential (GND) or a source potential) in many cases. Thus, a voltage can be referred to as a potential and vice versa. Note that the potential indicates a relative value. Accordingly, "ground potential" does not necessarily mean 0 V.

Note that in this specification and the like, the terms "film" and "layer" can be interchanged in accordance with the case or circumstances. For example, the term "conductive layer" can be replaced with the term "conductive film" in some cases. For example, the term "insulating film" can be replaced with the term "insulating layer" in some cases.

Note that the layout of circuit blocks in drawings specifies the positional relation for description. Thus, even when a drawing shows that different functions are achieved in different circuit blocks, an actual circuit or region may be configured so that the different functions are achieved in the same circuit block. Furthermore, the function of each circuit block in a drawing is specified for description. Thus, even when one circuit block is shown, an actual circuit or region may be configured so that processing which is illustrated as being performed in the one circuit block is performed in a plurality of circuit blocks.

In this specification and the like, when it is explicitly described that X and Y are connected, the case where X and Y are electrically connected, the case where X and Y are functionally connected, and the case where X and Y are directly connected are included therein. Accordingly, another element may be provided between elements having a connection relation illustrated in drawings and texts, without being limited to a predetermined connection relation, for example, the connection relation illustrated in the drawings and the texts. Here, X and Y each denote an object (e.g., a device, an element, a circuit, a wiring, an electrode, a terminal, a conductive film, a layer, or the like).

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings. For example, the following can be included: variation in signal, voltage, or current due to noise or difference in timing.

According to one embodiment of the present invention, a semiconductor device capable of detecting a minute current with high accuracy can be provided. According to one embodiment of the present invention, a semiconductor device capable of detecting a minute current with small power consumption can be provided. According to one embodiment of the present invention, a novel semiconductor device or an operation method of a novel semiconductor device can be provided.

Note that the description of the plurality of effects does not preclude the existence of other effects. In one embodiment of the present invention, there is no need to achieve all the effects described above. In one embodiment of the present invention, an object other than the above objects, an effect other than the above effects, and a novel feature will be apparent from the description of the specification and the drawings.

BRIEF DESCRIPTION OF THE DRAWINGS

In the accompanying drawings:

FIG. 5 is flow diagrams illustrating operation examples of a semiconductor device;

DETAILED DESCRIPTION OF THE INVENTION

Figure 1:
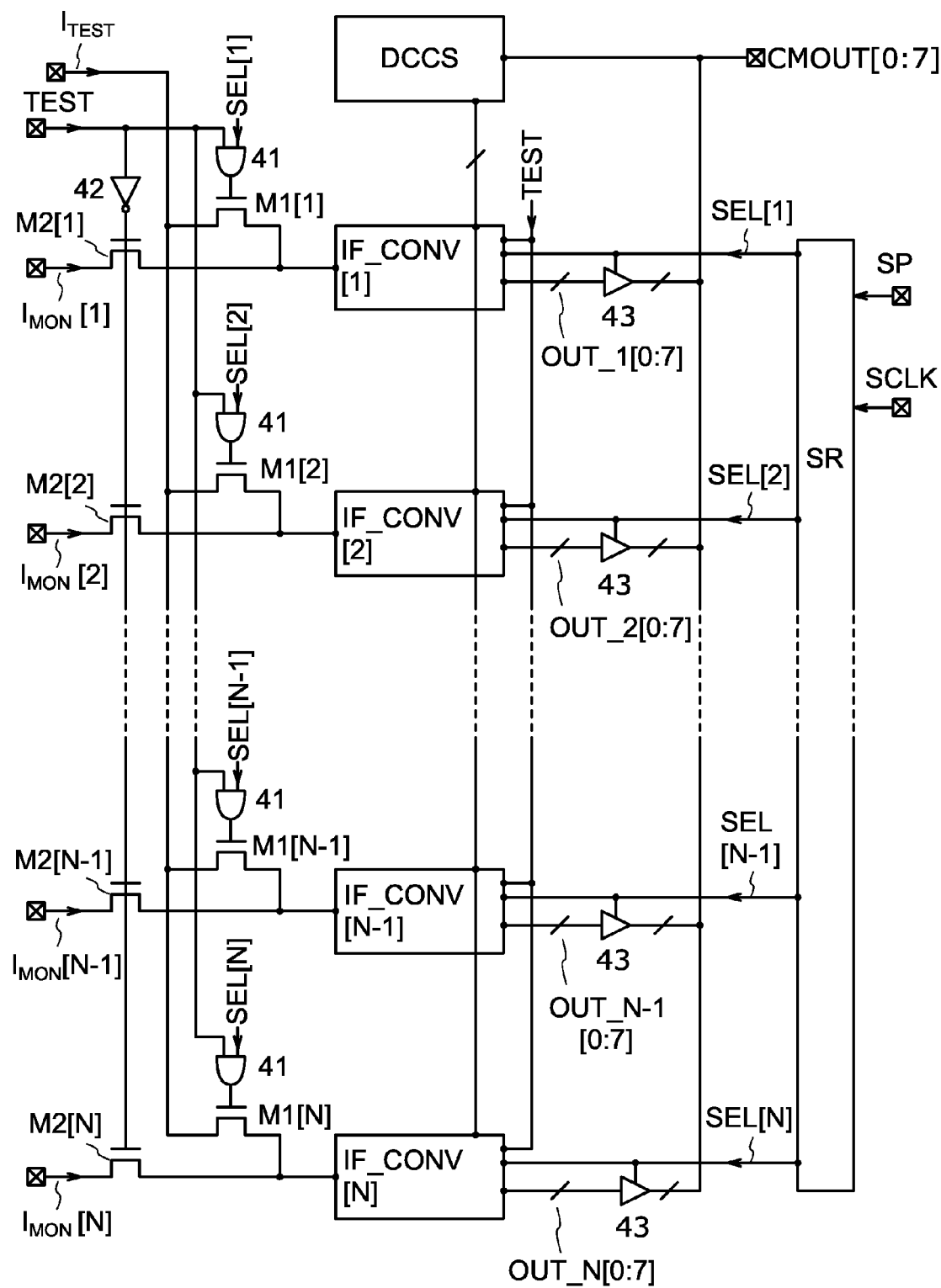
FIG. 1 is a circuit diagram showing a configuration example of a semiconductor device.

Hereinafter, an embodiment of the present invention will be described. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments.

Any of the embodiments below can be combined as appropriate. In addition, in the case where some structural or configuration examples are given in one embodiment, any of the structural or configuration examples can be combined as appropriate.

In the drawings, the same components, components having similar functions, components formed of the same material, or components formed at the same time are denoted by the same reference numerals in some cases, and description thereof is not repeated in some cases.

When the same reference numerals need to be distinguished from each other, "1", "2", "[n]", "[m, n]", or the like may be added to the reference numerals.

(Embodiment 1)

In this embodiment, a semiconductor device of one embodiment of the present invention will be described with reference to FIGS. 1 to 6.

<<Configuration Example 1 of Semiconductor Device>>

FIG. 1 is a circuit diagram showing a configuration example of a semiconductor device 10. The semiconductor device 10 includes a plurality of transistors M1 (M1[1] to M1[N], where N is a natural number of 1 or more), a plurality of transistors M2 (M2[1] to M2[N]), an inverter 42, a plurality of ANDs 41, a plurality of circuits IF_CONV (IF_CONV[1] to IF_CONV[N]), a circuit DCCS (digital calibration control system), a plurality of TRIBUFs (tri-state buffer circuits) 43, and a circuit SR (shift register).

Although the description below will be made regarding the transistors M1 and the transistors M2 as n-channel transistors, one embodiment of the present invention can be used in the case where the transistors M1 and the transistors M2 are p-channel transistors.

Signals $I_{MON}$ ($I_{MON}[1]$ to $I_{MON}[N]$) in FIG. 1 each include the value of a current flowing in a pixel of a display device (i.e., an analog signal) as data. The semiconductor device 10 has a function of converting these signals $I_{MON}$ into digital signals and outputting them as signals CMOUT.

A signal $I_{TEST}$ in FIG. 1 includes the value of a current to be a reference (i.e., an analog signal) as data. The semiconductor device 10 has a function of calibrating an error that occurs when the signal CMOUT is generated from the signal $I_{MON}$, by utilizing the signal $I_{TEST}$.

The signal $I_{TEST}$ is input to the circuit IF_CONV via the transistor M1. The signal $I_{MON}$ is input to the circuit IF_CONV via the transistor M2. Note that the signals $I_{MON}$ and $I_{TEST}$ can convey data on not only a current flowing from an external pixel into the circuit IF_CONV but also a current flowing from the circuit IF_CONV into the external pixel.

Switching between the signals to be input to the circuit IF_CONV can be performed through the control of the on (conducting) and off (non-conducting) states of the transistors M1 and M2. Further, the control of the on/off states of the transistors M1 and M2 is performed by a signal TEST. The signal TEST is supplied to a gate of the transistor M1 via the AND 41 and to a gate of the transistor M2 via the inverter 42.

The circuit IF_CONV has a function of converting input analog signals into signals OUT (signals OUT_1 to OUT_N) that are digital signals and outputting the signals OUT.

The circuit SR is a shift register, and has a function of selecting one signal from the signals OUT_1 to OUT_N. A signal SP and a signal SCLK in FIG. 1 represent a pulse signal and a clock signal input to the circuit SR, respectively.

The circuit SR outputs a plurality of signals SEL (SEL[1] to SEL[N]). One of the signals SEL[1] to SEL[N] is set at a high level (hereinafter, H level), and each of the other N−1 signals is set at a low level (hereinafter, L level). The signal SEL set at the H level turns on the TRIBUF 43. The signal SEL set at the L level makes the TRIBUF 43 have high impedance. The signal OUT selected by the circuit SR through the above manner is output to the outside as the signal CMOUT.

The case where the signal SEL[1] and the signal TEST are set at the H level is considered, for example. Then, the H-level potential is supplied to the gate of the transistor M1[1], and the transistor M1[1] is turned on. In contrast, the L-level potentials are supplied to the gates of the transistors M2[1] to M2[N], and the transistors M2[1] to M2[N] are turned off. Further, the signals SEL[2] to SEL[N] are set to the L level, and the transistors M1[2] to M1[N] are turned off. Accordingly, only the transistor M1[1] is turned on, and the signal $I_{TEST}$ is input to the circuit IF_CONV[1].

The case where the signal SEL[1] is set at the H level and the signal TEST is set at the L level is considered, for example. Then, the L-level potentials are supplied to the gates of the transistors M1[1] to M1[N], and the transistors M1[1] to M1[N] are turned off. In contrast, the H-level potentials are supplied to the gates of the transistors M2[1] to M2[N], and the transistors M2[1] to M2[N] are turned on. Accordingly, the signals $I_{MON}[1]$ to $I_{MON}[N]$ are input to the circuits IF_CONV. Since the signals SEL other than the signal SEL[1] are set at the L level, only the signal OUT_1 is output to the outside as the signal CMOUT.

The circuit DCCS has a function of calibrating the conversion function of the above-described circuit IF_CONV. In the case where the signal TEST is set at an H level, the signal $I_{TEST}$ is input to the circuit IF_CONV and output as the signal OUT. The signal OUT is input to the circuit DCCS.

The circuit DCCS also has a function of generating a signal X in the case where the signal $I_{TEST}$ is ideally converted into a digital signal. The circuit DCCS compares the signal OUT and the signal X, and conveys to the circuit IF_CONV the amount of calibration of the signal OUT in accordance with the difference between the two signals. The circuit IF_CONV converts the signal $I_{MON}$ into the signal OUT in accordance with the determined calibration amount. The signal $I_{MON}$ is finally output to the outside as the signal CMOUT.

Note that, in addition to the above signals, a signal CLK1 and a signal CLK2 are input to the semiconductor device 10 from the outside. These signals are input to the circuit IF_CONV and the circuit DCCS, and used for the operations of the circuits.

Although an example in which 8-bit data are handled is described in this embodiment, one embodiment of the present invention is not limited thereto and arbitrary k-bit (k is a natural number of 1 or more) data can also be handled.

In the semiconductor device 10, it is preferable that the transistors M1 be transistors with low off-state current. Off-state current refers to a leakage current that flows when the transistor is off. In other words, off-state current refers to a leakage current that flows between a source and a drain when a voltage lower than the threshold voltage is applied between a gate and the source of an n-channel transistor (or when a voltage higher than the threshold value is applied between a gate and the source of a p-channel transistor).

The case where the transistor M1[1] is on and the transistors M1[2] to M1[N] are off is considered, for example. Since the transistors M1[2] to M1[N] are connected in parallel to the transistor M1[1], when off-state current of the transistors M1[2] to M1[N] is high, a current of the signal $I_{TEST}$ leaks to the outside through the transistors M1[2] to M1[N]. Conveying data on a current as low as 1 nA to several hundred nanoamperes, the signal $I_{TEST}$ is seriously affected even by a small leakage of current. Therefore, the current of the signal $I_{TEST}$ is not accurately conveyed to the circuit IF_CONV[1], and calibration is not accurately performed by the circuit DCCS.

Thus, the use of transistors with low off-state current as the transistors M1 enables the semiconductor device 10 to measure the current value of the signal $I_{TEST}$ with high accuracy.

In addition, the use of transistors with low off-state current as the transistors M1 enables the semiconductor device 10 to measure the current value of the signal $I_{TEST}$ with small power consumption.

A semiconductor material whose band gap is wider than that of silicon and whose intrinsic carrier density is lower than that of silicon is preferably used for channel formation regions of the transistors M1. For example, an oxide semiconductor is preferable as the semiconductor material. An oxide semiconductor transistor in which an oxide semiconductor is used for a channel formation region has significantly low off-state current.

In the semiconductor device 10, elements other than the transistors M1 may be formed on a semiconductor substrate such as Si or SiGe and oxide semiconductor transistors may be formed thereover as the transistors M1, for example.

The above-described transistors with low off-state current are preferably used not only as the transistors M1 but also as the transistors M2. Reduction in off-state current of not only the transistors M1 but also the transistors M2 enables the semiconductor device 10 to measure the current values of the signal $I_{MON}$ and the signal $I_{TEST}$ with even higher accuracy with even smaller power consumption.

In that case, elements other than the transistors M1 and the transistors M2 may be formed on a semiconductor substrate such as Si or SiGe and oxide semiconductor transistors may be formed thereover as the transistors M1 and the transistors M2, for example.

The details of the oxide semiconductor transistor will be described later in Embodiment 3.

<Configuration Example of Circuit IF_CONV>

Next, a specific configuration example of the circuit IF_CONV shown in FIG. 1 will be described. To make the description clearer, the basic operation of the circuit IF_CONV will be described first. The case in which the circuit IF_CONV is connected to the circuit DCCS and has a calibration function will be described later.

Figure 2:
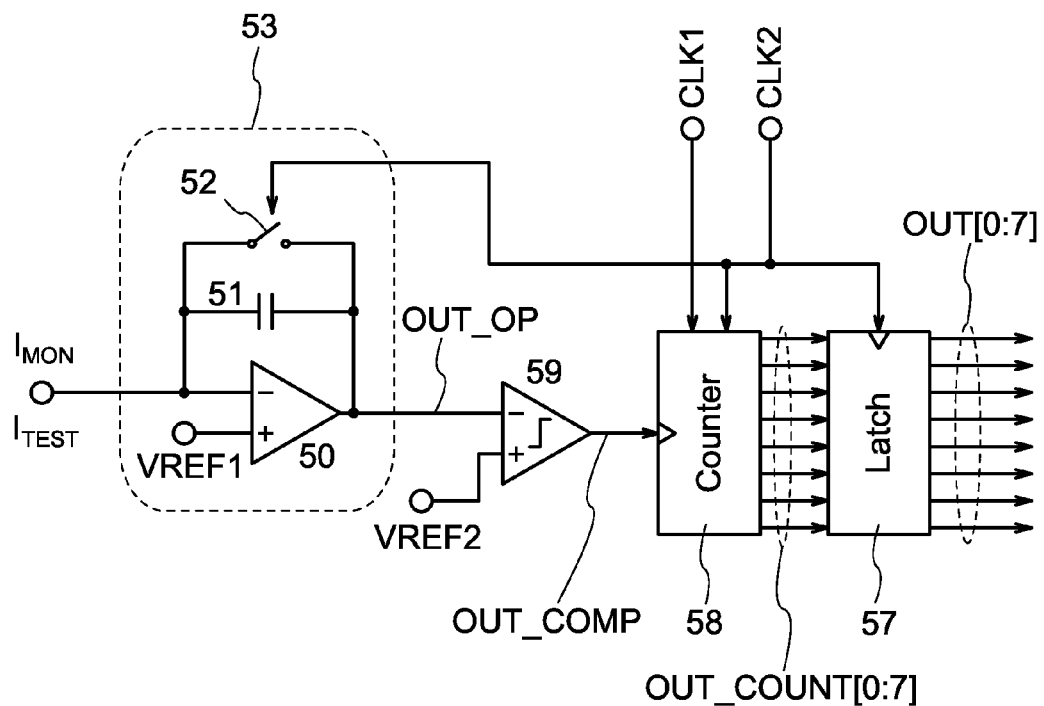
FIG. 2 is a circuit diagram showing a configuration example of a semiconductor device.

FIG. 2 shows an example of a circuit diagram of the circuit IF_CONV. The circuit IF_CONV includes a latch 57, a counter 58, a comparator 59, and an integrator circuit 53. The integrator circuit 53 includes an operational amplifier 50, a capacitor 51, and a switch 52.

The signal CLK1 and the signal CLK2 are input from the outside to the circuit IF_CONV. The frequency of the signal CLK1 is different from that of the signal CLK2 and is preferably higher than that of the signal CLK2. The signal CLK1 is input to the counter 58, and the signal CLK2 is input to the switch 52, the counter 58, and the latch 57.

One electrode of the capacitor 51 is electrically connected to an inverting input terminal (−) of the operational amplifier 50, and the other electrode of the capacitor 51 is electrically connected to an output terminal of the operational amplifier 50.

The switch 52 is positioned between the one electrode of the capacitor 51 and the other electrode of the capacitor 51. The switch 52 is turned on or off in response to the signal CLK2. The switch 52 may be a transistor.

The signal $I_{MON}$ or the signal $I_{TEST}$ is input to the inverting input terminal of the operational amplifier 50, a potential VREF1 is input to a non-inverting input terminal (+) of the operational amplifier 50, and the output terminal of the operational amplifier 50 outputs a signal OUT_OP.

The operational amplifier 50 is an amplifier circuit and has a function of amplifying and outputting a potential difference between the inverting input terminal and the non-inverting input terminal.

An inverting input terminal (−) of the comparator 59 is electrically connected to the output terminal of the operational amplifier 50. The signal OUT_OP is input to the inverting input terminal of the comparator 59, a potential VREF2 is input to a non-inverting input terminal (+) of the comparator 59, and an output terminal of the comparator 59 outputs a signal OUT_COMP.

The comparator 59 has a function of comparing a first potential supplied to the non-inverting input terminal with a second potential supplied to the inverting input terminal, outputting an H-level potential in the case where the first potential is higher than the second potential, and outputting an L-level potential in the case where the first potential is lower than the second potential.

The counter 58 has a function of counting the number of times when the potential of the signal CLK1 is changed from the H level to the L level (or from the L level to the H level), and a function of outputting the number (the number of counts) as a signal OUT_COUNT. Furthermore, the counter 58 includes a latch circuit and has a function of holding the number of counts obtained just before the potential of the signal OUT_COMP is changed from the L level to the H level. Moreover, the counter 58 has a function of initializing the number of counts of the signals OUT_COUNT to zero when supplied with the signal CLK2. Note that the number of times when the potential of the signal CLK1 is changed from the H level to the L level (or from the L level to the H level) may be referred to as the number of pulses of the signal CLK1.

The latch 57 has a function of storing the signal OUT_COUNT input just before the potential of the signal CLK2 is changed from the L level to the H level, and outputting the signal as a signal OUT.

Next, an example of the operation of the circuit IF_CONV will be described with reference to a timing chart shown in FIG. 3.

Figure 3:
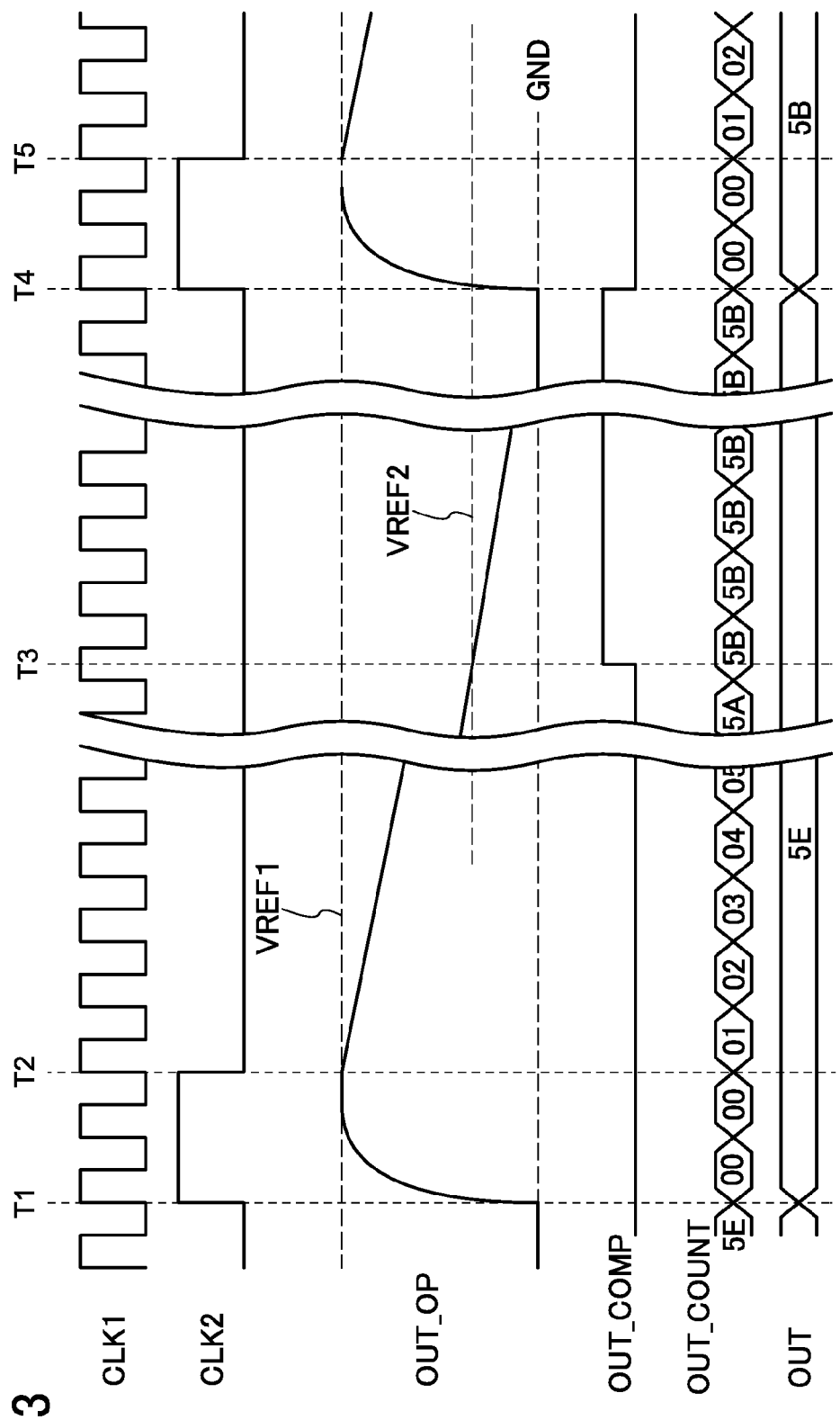
FIG. 3 is a timing chart illustrating an operation example of a semiconductor device.

The timing chart in FIG. 3 shows changes in the potentials of the signals CLK1, CLK2, OUT_OP, OUT_COMP, OUT_COUNT, and OUT. Times T1 to T5 in FIG. 3 are used to describe operation timing.

As described above, the signal OUT_COUNT and the signal OUT each include the number of counts of the signals CLK1, and FIG. 3 shows an example in which the number of counts is represented by an 8-bit hexadecimal number.

First, at Time T1, the potential of the signal CLK2 is changed from the L level to the H level. At this time, the switch 52 is turned on, so that discharge of the capacitor 51 is started. After that, the potential of the signal OUT_OP is initialized to the potential VREF1.

Furthermore, at Time T1, the counter 58 is reset, so that the signal OUT_COUNT becomes "00". At the same time, the latch 57 stores the signal OUT_COUNT just before Time T1 and outputs the signal OUT_COUNT as the signal OUT. FIG. 3 shows that data (5E) of the signal OUT_COUNT before Time T1 is output as the signal OUT after Time T1.

Next, at Time T2, the potential of the signal CLK2 is changed from the H level to the L level. At this time, the switch 52 is turned off, so that charging of the capacitor 51 begins and integration of the integrator circuit 53 is started. A potential obtained by integrating the signal $I_{MON}$ or signal $I_{TEST}$ with time is output as the signal OUT_OP. The potential of the signal OUT_OP gradually decreases.

Furthermore, at Time T2, the counter 58 starts counting of the number of times when the potential of the signal CLK1 changes from the H level to the L level (or from the L level to the H level), and outputs the number of counts as the signal OUT_COUNT.

Next, at Time T3, the potential of the signal OUT_OP becomes equal to the potential VREF2, and the potential of the signal OUT_COMP is changed from the L level to the H level. At this time, the latch circuit included in the counter 58 functions, so that the number of counts at Time T3 (5B in FIG. 3) is held as the signal OUT_COUNT.

After that, the potential of the signal OUT_OP keeps decreasing to reach a potential GND.

Next, at Time T4, like at Time T1, the potential of the signal CLK2 is changed from the L level to the H level, so that discharge of the capacitor 51 is started. After that, the potential of the signal OUT_OP is initialized to the potential VREF1.

Furthermore, at Time T4, the potential of the signal OUT_COMP is changed from the H level to the L level, so that a latch of the counter 58 is released. At the same time, the signal OUT_COUNT is initialized to "00" owing to the signal CLK2. Data of the signal OUT_COUNT just before Time T4 (5B in FIG. 3) is output as the signal OUT. This signal OUT corresponds to the current value of the signal $I_{MON}$ or the signal $I_{TEST}$. In other words, this signal OUT is a digital signal converted from the signal $I_{MON}$ or the signal $I_{TEST}$.

After that, through the repetition of the above operation, the signal $I_{MON}$ or the signal $I_{TEST}$ can be converted into the signal OUT.

<Configuration Example of Circuit IF_CONV Having Calibration Function>

Next, a configuration example in which the circuit IF_CONV is combined with the circuit DCCS that has a calibration function will be described with reference to FIG. 4.

Figure 4:
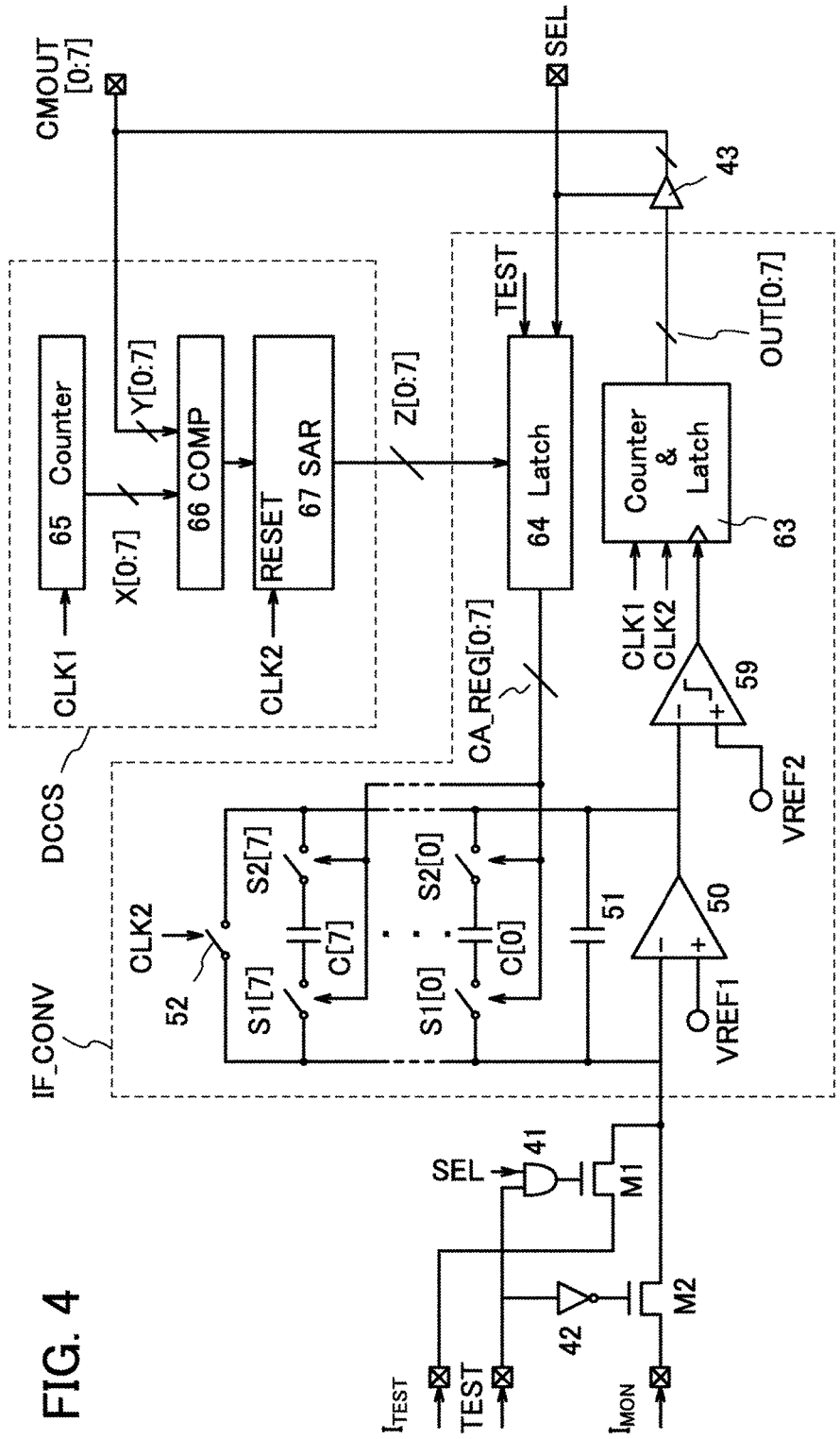
FIG. 4 is a circuit diagram showing a configuration example of a semiconductor device.

In FIG. 4, a plurality of capacitors C (C[0] to C[7]) that are connected in parallel, a plurality of switches S1 (S1[0] to S1[7]) and switches S2 (S2[0] to S2[7]) that control the electrical connection of the capacitors C, and a latch 64 are added to the circuit IF_CONV shown in FIG. 2. Further, in the circuit IF_CONV shown in FIG. 4, the counter 58 and the latch 57 of the circuit IF_CONV in FIG. 2 are illustrated as one circuit 63.

The circuit DCCS in FIG. 4 includes a counter 65, a comparator 66, and a successive approximation register (SAR) 67.

The counter 65 has a function of receiving a signal CLK1 and generating a signal X. The signal X is a digital signal that is obtained when the signal $I_{TEST}$ is ideally converted by the circuit IF_CONV.

The comparator 66 has a function of comparing a signal Y with the signal X and outputting the comparison result as one of two values, either "1" (H level) or "0" (L level). It is assumed, for example, that the comparator 66 outputs "1" when X≥Y and "0" when X<Y.

The SAR 67 is a successive approximation register. The SAR 67 has a function of receiving the comparison result of the comparator 66 and generating a signal Z.

The latch 64 has a function of temporarily holding the signal Z. In the case where the signal TEST and the signal SEL are set at the H level, the latch 64 is unlatched and passes the signal Z to the integrator circuit as a signal CA_REG.

Because of variations of capacitors included in the integrator circuit, an error is introduced in the signal OUT output from the circuit IF_CONV. The circuit DCCS has a function of supplying the signal Z for calibrating such an error to the circuit IF_CONV.

The steps by which the circuit IF_CONV and the circuit DCCS calibrate the signal will be described below with reference to FIG. 5. Note that in the following description, the actual circuit operation is simplified to some extent for clarity of description, and one embodiment of the present invention is not limited thereto. For example, although FIG. 5 shows the steps of processing 6-bit signals, one embodiment of the present invention can be employed in handling an arbitrary k-bit (k is a natural number of 1 or more) data.

First, the signal TEST is set at an H level, and the signal $I_{TEST}$ is converted into the signal OUT via the circuit IF_CONV.

The signal OUT is input to the circuit DCCS as the signal Y via the TRIBUF 43.

The comparator 66 compares the signal X with the signal Y, and passes the comparison result to the SAR 67. For example, with X=45 and Y=32, X≥Y is satisfied and "1" is output (Step 1 in FIG. 5).

Then, the SAR 67 determines the signal Z in response to the comparison result of the comparator 66. For example, Z=16 is given.

The latch 64 receives the signal Z and passes it as the signal CA_REG to the integrator circuit.

The integrator circuit determines the on/off states of the switches S1 and S2 in accordance with the signal CA_REG, and changes the value of capacitance to be added. Accordingly, the circuit IF_CONV is updated.

Through the updated circuit IF_CONV, the signal $I_{TEST}$ is converted into a digital signal again, and input to the comparator 66 as the signal Y. At this time, the signal Y is 32+16=48.

With X=45 and Y=48, X<Y is satisfied and the comparator 66 outputs "0" (Step 2 in FIG. 5).

The SAR 67 discards Z=16 that was given earlier, in response to the comparison result of the comparator. Then, Z=8 is given, for example.

The signal Y is input to the comparator 66 again though the same steps as above. At this time, Y=32+8=40 is given.

With X=45 and Y=40, X≥Y is satisfied and the comparator 66 outputs "1" (Step 3 in FIG. 5).

The SAR 67 adopts Z=8 that was given earlier, in response to the comparison result of the comparator 66. Then, Z=8+4=12 is given, for example.

The signal Y is input to the comparator 66 again through the same steps as above. At this time, Y=32+8+4=44 is given.

With X=45 and Y=44, X≥Y is satisfied and the comparator 66 outputs "1" (Step 4 in FIG. 5).

The SAR 67 adopts Z=8+4 that was given earlier, in response to the comparison result of the comparator 66. Then, Z=8+4+2=14 is given, for example.

The signal Y is input to the comparator 66 again through the same steps as above. At this time, Y=32+8+4+2=46 is given.

With X=45 and Y=46, X<Y is satisfied and the comparator 66 outputs "0" (Step 5 in FIG. 5).

The SAR 67 discards Z=8+4+2 that was given earlier, in response to the comparison result of the comparator 66. Then, Z=8+4+1=13 is given, for example.

The signal Y is input to the comparator 66 again through the same steps as above. At this time, Y=32+8+4+1=45 is given.

With X=45 and Y=45, X≥Y is satisfied and the comparator 66 outputs "1" (Step 6 in FIG. 5).

The SAR 67 adopts Z=8+4+1 that was given earlier, in response to the comparison result of the comparator 66.

Through the above steps, the circuit DCCS determines the signal Z (Z=8+4+1=13) that calibrates the circuit IF_CONV.

After the signal Z is determined, the signal TEST is set at an L level and the signal $I_{MON}$ is input to the circuit IF_CONV. At this time, since the latch 64 is holding the signal CA_REG, the circuit IF_CONV maintains the calibrated condition.

Finally, the calibrated signal OUT is output to the outside as the signal CMOUT.

With the above-described configuration, the semiconductor device 10 can detect a minute current with high accuracy. In addition, the semiconductor device 10 can detect a minute current with small power consumption.

<<Configuration Example 2 of Semiconductor Device>>

Figure 6:
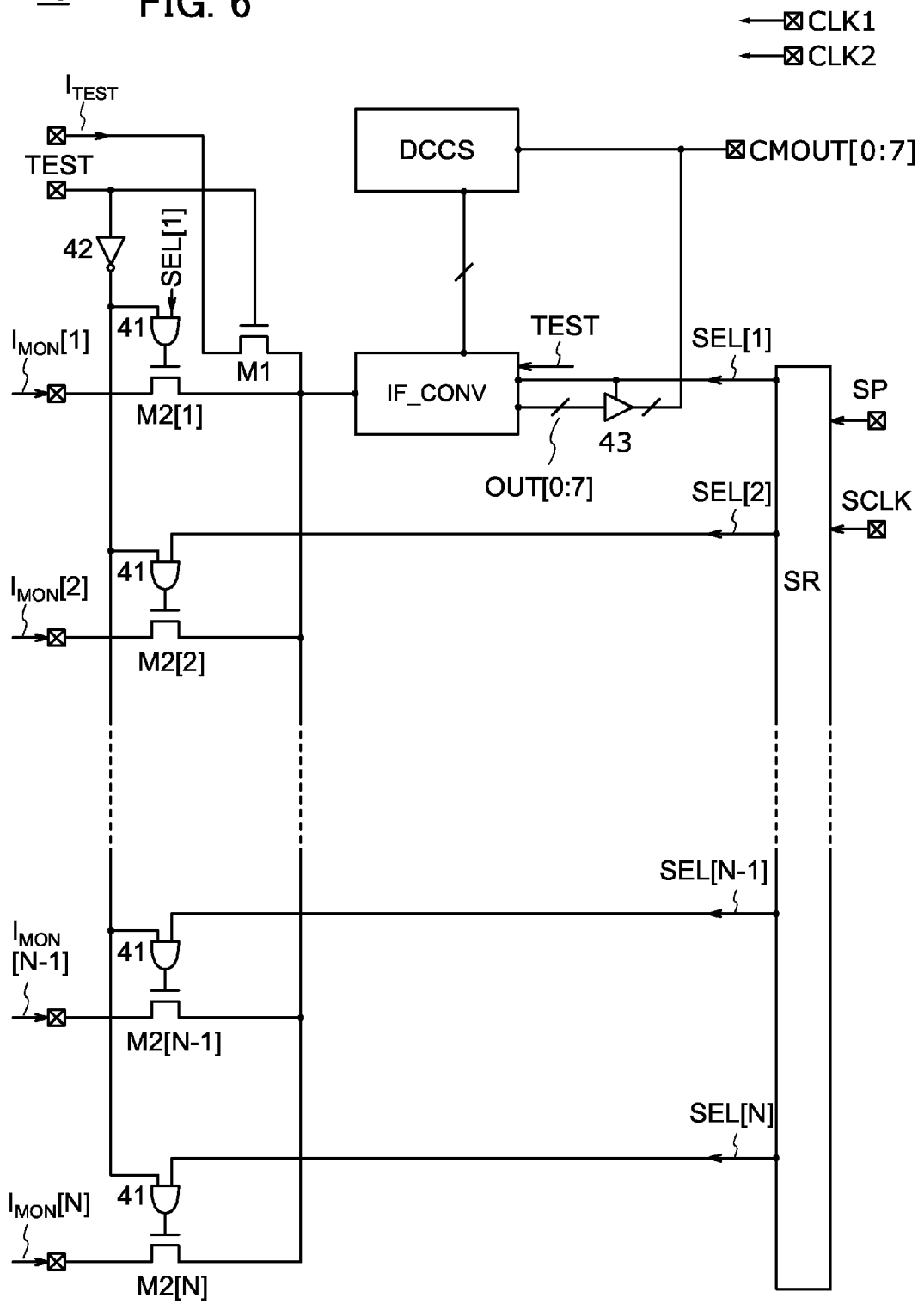
FIG. 6 is a circuit diagram showing a configuration example of a semiconductor device.

FIG. 6 shows a configuration example of a semiconductor device 20 which is one embodiment of the present invention.

The semiconductor device 10 in FIG. 1 includes the plurality of circuits IF_CONV, and the respective signals $I_{MON}[1]$ to $I_{MON}[N]$ are input to the circuits IF_CONV. In contrast, in the semiconductor device 20 in FIG. 6, the signals $I_{MON}[1]$ to $I_{MON}[N]$ are all input to one circuit IF_CONV.

Having such a configuration as shown in FIG. 6, the semiconductor device 20 with the smaller area occupied by circuits can be reduced in size.

In addition, in the semiconductor device 20 having such a configuration as shown in FIG. 6, negative effect that would be caused by variations of the circuits IF_CONV can be reduced.

In the semiconductor device 20, it is preferable that the transistors M2 be transistors with low off-state current. The case where the transistor M2[1] is on and the transistors M2[2] to M2[N] are off is considered, for example. Since the transistors M2[2] to M2[N] are connected in parallel to the transistor M2[1], when off-state current of the transistors M2[2] to M2[N] is high, a current of the signal $I_{MON}[1]$ leaks to the outside through the transistors M2[2] to M2[N]. Conveying data on a current as low as 1 nA to several hundred nanoamperes, the signal $I_{MON}$ is seriously affected even by a small leakage of current. Therefore, the semiconductor device 20 cannot accurately measure the current value of the signal $I_{MON}$.

Thus, the use of transistors with low off-state current as the transistors M2 enables the semiconductor device 20 to measure the current value of the signal $I_{MON}$ with high accuracy.

In addition, the use of transistors with low off-state current as the transistors M2 enables the semiconductor device 20 to measure the current value of the signal $I_{MON}$ with small power consumption.

A semiconductor material whose band gap is wider than that of silicon and whose intrinsic carrier density is lower than that of silicon is preferably used for channel formation regions of the transistors M2. For example, an oxide semiconductor is preferable as the semiconductor material. An oxide semiconductor transistor in which an oxide semiconductor is used for a channel formation region has significantly low off-state current.

In the semiconductor device 20, elements other than the transistors M2 may be formed on a semiconductor substrate such as Si or SiGe and oxide semiconductor transistors may be formed thereover as the transistors M2, for example.

The above-described transistors with low off-state current are preferably used not only as the transistors M2 but also as the transistor M1. Reduction in off-state current of not only the transistors M2 but also the transistor M1 enables the semiconductor device 20 to measure the current values of the signal $I_{MON}$ and the signal $I_{TEST}$ with even higher accuracy with even smaller power consumption.

In that case, elements other than the transistor M1 and the transistors M2 may be formed over a semiconductor substrate such as Si or SiGe and oxide semiconductor transistors may be formed thereover as the transistor M1 and the transistors M2, for example.

With the above-described configuration, the semiconductor device 20 can detect a minute current with high accuracy. In addition, the semiconductor device 20 can detect a minute current with small power consumption.

(Embodiment 2)

In this embodiment, an example of a display device that includes the semiconductor device 10 or the semiconductor device 20 described in Embodiment 1 will be described.

<<Display Device>>

Figure 7:
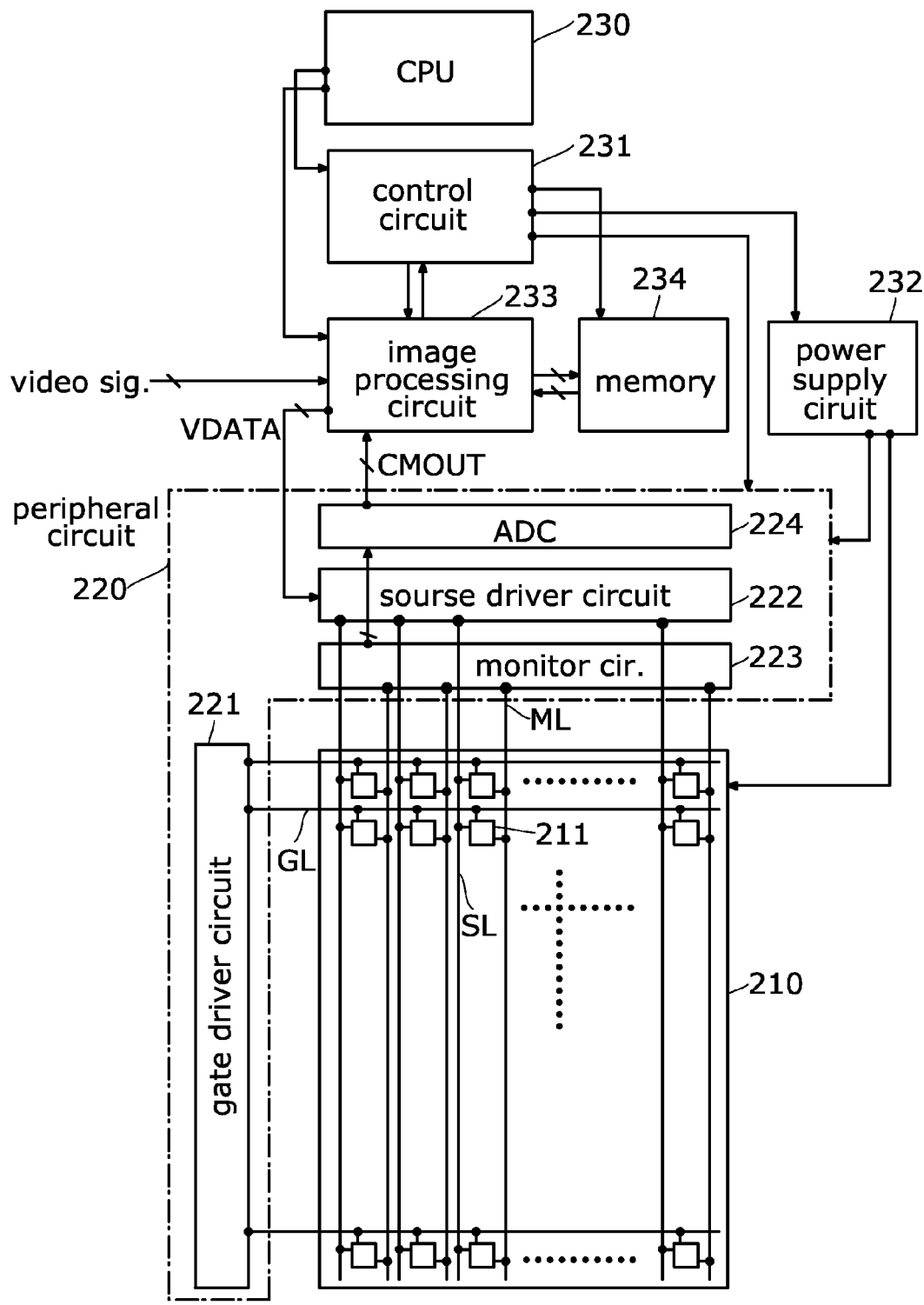
FIG. 7 is a circuit block diagram showing a configuration example of a display device.

FIG. 7 is a block diagram illustrating a configuration example of a display device. The display device 200 includes a pixel portion 210, a peripheral circuit 220, a CPU 230, a control circuit 231, a power supply circuit 232, an image processing circuit 233, and a memory 234.

The CPU 230 is a circuit for executing an instruction and controlling the display device 200 collectively. The CPU 230 executes an instruction input from the outside and an instruction stored in an internal memory. The CPU 230 generates signals for controlling the control circuit 231 and the image processing circuit 233. On the basis of a control signal from the CPU 230, the control circuit 231 controls the operation of the display device 200. The control circuit 231 controls the peripheral circuit 220, the power supply circuit 232, the image processing circuit 233, and the memory 234 so that the process determined by the CPU 230 is executed. To the control circuit 231, for example, a variety of synchronization signals which determine timing of updating the screen are input. Examples of the synchronization signals include a horizontal synchronization signal, a vertical synchronization signal, and a reference clock signal. The control circuit 231 generates control signals of the peripheral circuit 220 from these signals. The power supply circuit 232 has a function of supplying power supply voltage to the pixel portion 210 and the peripheral circuit 220.

The pixel portion 210 includes a plurality of pixels 211, a plurality of wirings GL, a plurality of wirings SL, and a plurality of wirings ML. The plurality of pixels 211 are arranged in an array. The plurality of wirings GL, SL, and ML are provided in accordance with the arrangement of the plurality of pixels 211. The wirings GL are arranged in a vertical direction. The wirings SL and ML are arranged in a horizontal direction. The wiring GL is also referred to as a gate line, a scan line, a selection signal line, or the like. The wiring SL is also referred to as a source line, a data line, or the like. The wiring ML is provided to monitor the pixels 211, and can be referred to as a monitor wiring, for example.

The peripheral circuit 220 includes a gate driver circuit 221, a source driver circuit 222, a monitor circuit 223, and an analog-to-digital conversion circuit (ADC) 224.

The gate driver circuit 221 is a circuit for driving the wiring GL and has a function of generating a signal supplied to the wiring GL. The source driver circuit 222 is a circuit for driving the wiring SL and has a function of generating a signal supplied to the wiring SL. The monitor circuit 223 is capable of detecting an analog signal flowing in the wiring ML. The ADC 224 is a circuit for converting an analog signal output from the monitor circuit 223 to a digital signal. The ADC 224 outputs a signal CMOUT to the image processing circuit 233.

In the display device 200, the semiconductor device 10 or the semiconductor device 20 in Embodiment 1 is used in the ADC 224.

The image processing circuit 233 has a function of processing a video signal input from the outside and generating a data signal VDATA. The data signal VDATA is a digital signal that represents a gray scale. Furthermore, the image processing circuit 233 has a function of correcting the data signal VDATA using the signal CMOUT. The source driver circuit 222 has a function of processing the data signal VDATA and generating a data signal supplied to each wiring SL. The memory 234 is provided to store data needed for performing processing in the image processing circuit 233. The signal CMOUT, the data signal VDATA, or a video signal input from the outside is stored in the memory 234, for example.

Figure 8:
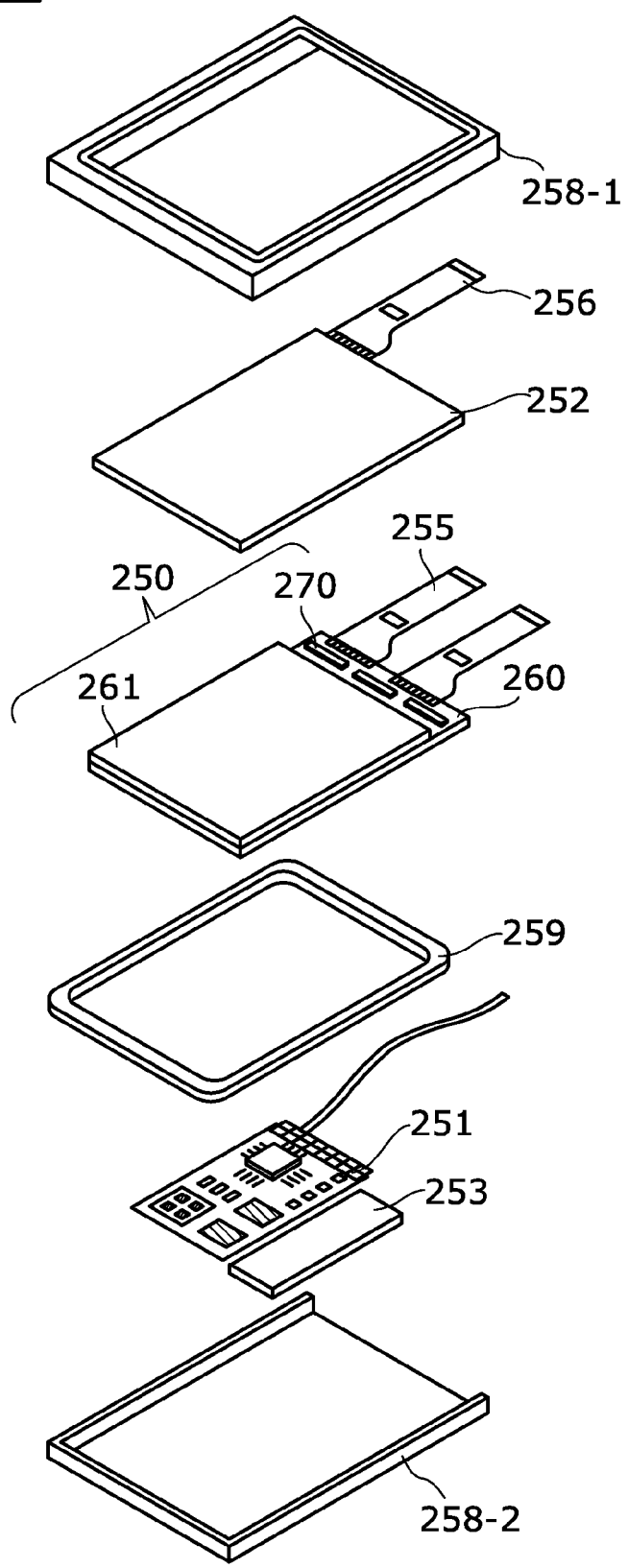
FIG. 8 is an exploded perspective view showing a structural example of a display device.

FIG. 8 is an exploded perspective view of the display device 200. The display device 200 includes, between an upper cover 258-1 and a lower cover 258-2, a touch panel unit 252 to which an FPC 256 is connected, a display panel 250 to which an FPC 255 is connected, a frame 259, a printed board 251, and a battery 253. The battery 253, the touch panel unit 252, and the like are not provided in some cases. Furthermore, a backlight unit that illuminates the display panel may be provided as needed.

The shapes and sizes of the upper cover 258-1 and the lower cover 258-2 can be changed as appropriate in accordance with the sizes of the touch panel unit 252 and the display panel 250. The frame 259 protects the display panel 250 and also functions as an electromagnetic shield for blocking electromagnetic waves generated by the operation of the printed board 251. The frame 259 may function as a radiator plate.

The printed board 251 includes the CPU 230, the power supply circuit 232, the image processing circuit 233, and the memory 234. As a power source for supplying power to the power supply circuit 232, an external commercial power source or a power source using the battery 253 provided separately may be used. The battery 253 can be omitted in the case where a commercial power source is used. The display device 200 may be additionally provided with a member such as a polarizing plate, a retardation plate, or a prism sheet.

The touch panel unit 252 can be a resistive touch panel or a capacitive touch panel and can be formed to overlap with the display panel 250. A counter substrate (sealing substrate) of the display panel 250 can have a touch panel function. A photosensor may be provided in each pixel of the display panel 250 to form an optical touch panel. An electrode for a touch sensor may be provided in each pixel of the display panel 250 so that a capacitive touch panel is obtained.

The display panel 250 in FIG. 8 includes a substrate 260 and a substrate (counter substrate) 261. The substrate 260 is provided with the pixel portion 210 and the peripheral circuit 220. The substrate 260 provided with a circuit such as the pixel portion 210 is referred to as an element substrate (backplane) in some cases. Part or all of the peripheral circuit 220 may be provided for the substrate 260 in the same manufacturing process as the pixel portion 210. In the example shown in FIG. 8, part of the peripheral circuit 220 is provided in an IC 270. The IC 270 is mounted on the substrate 260 by a chip on glass (COG) method.

<<Display Panel>>

Figure 9:
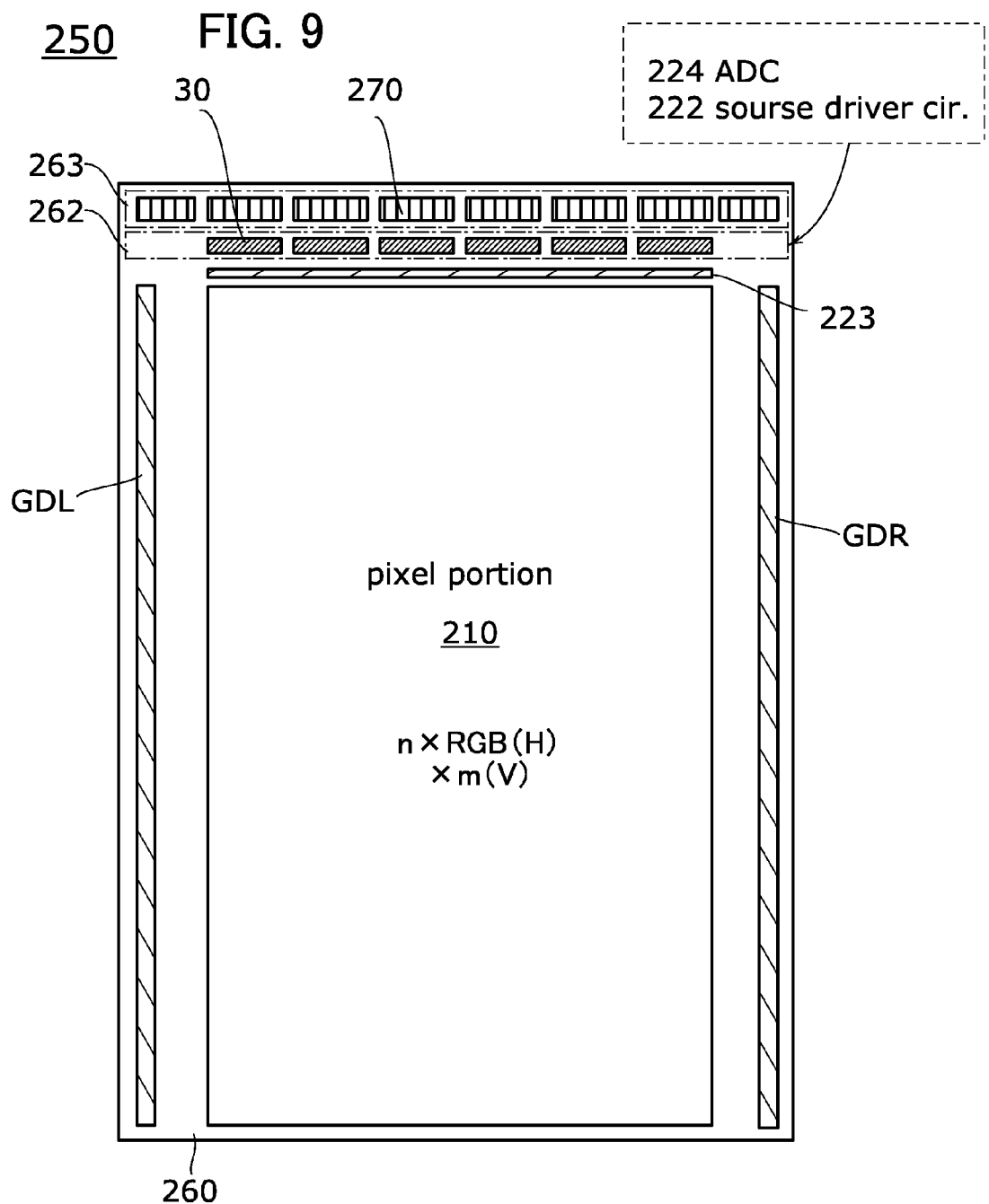
FIG. 9 is a plan view showing a structural example of a display panel.

FIG. 9 is a plan view illustrating a structure example of an element substrate of the display panel 250. Here, FIG. 9 is used as a reference of terms indicating positions, such as right, left, top, and bottom.

The display panel 250 is provided with the pixel portion 210 and the peripheral circuit 220 (circuits 221 to 224). The gate driver circuit 221 and the monitor circuit 223 of the peripheral circuit are formed over the substrate 260 in the same manufacturing process as the pixel portion 210. The gate driver circuit 221 is divided into two circuits GDL and GDR which are provided on the left and right of the pixel portion 210, respectively. For example, the wirings GL in the odd-numbered rows are electrically connected to the GDR, and the wirings GL in the even-numbered rows are electrically connected to the GDL. In this case, the GDL and the GDR drive the wirings GL alternately.

In a region 262, the source driver circuit 222 and the ADC 224 are provided. In the example shown in FIG. 9, the source driver circuit 222 and the ADC 224 include six driver ICs 30. The number of driver ICs 30 is not limited thereto. A plurality of terminals (not shown) are formed in the region 262, and the driver ICs 30 are electrically connected to the terminals.

In the following description of the display device 200, the resolution of the pixel portion 210 in the horizontal direction (H) is n×RGB and the resolution in the vertical direction (V) is m. Note that n and m each are an integer of 2 or more. RGB (red, green, and blue) represents colors displayed in the pixels 211. Here, three (RGB) pixels 211 (sub-pixels) form one unit pixel.

The structure of the unit pixel is not limited thereto, and the number of sub-pixels, the light-emitting colors of the sub-pixels, the arrangement of the sub-pixels in the unit pixel, and the like can be set as appropriate. For example, in the case where four sub-pixels form one unit pixel, a combination of colors to be displayed can be red (R), green (G), blue (B), and yellow (Y) or red (R), green (G), blue (B), and white (W). In this specification, in the case where the components are distinguished by colors displayed in the pixel, an identification sign such as "_R", "[R]", or "R[1]" is added. For example, a pixel 211_R represents a red pixel 211. Furthermore, a wiring SL_G[2] represents a wiring SL in the second column electrically connected to the pixel 211_G.

<<Pixel>>

Figure 10A:
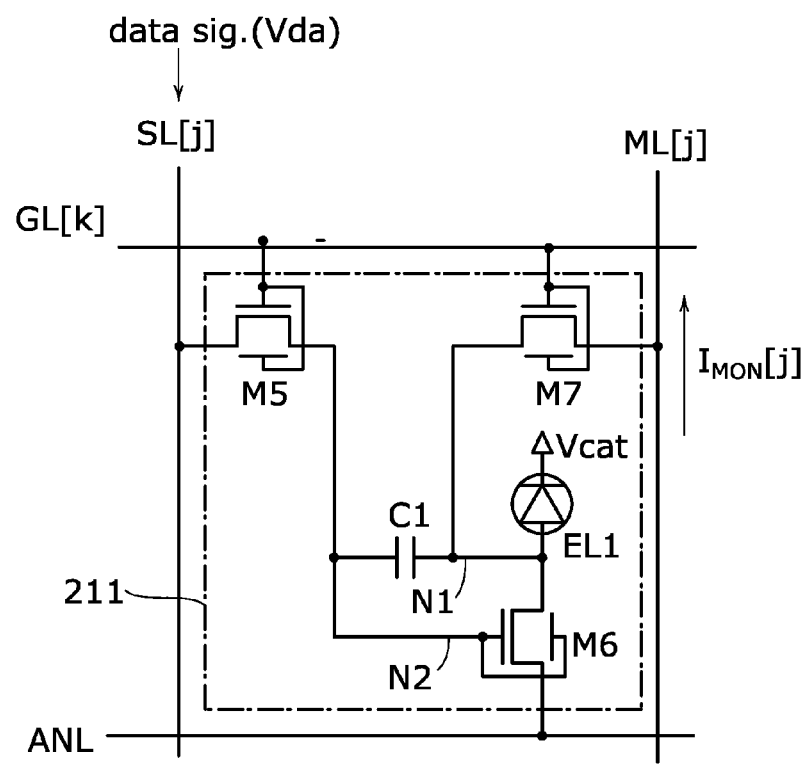
FIG. 10A is a circuit diagram showing a configuration example of a pixel.
Figure 10B:
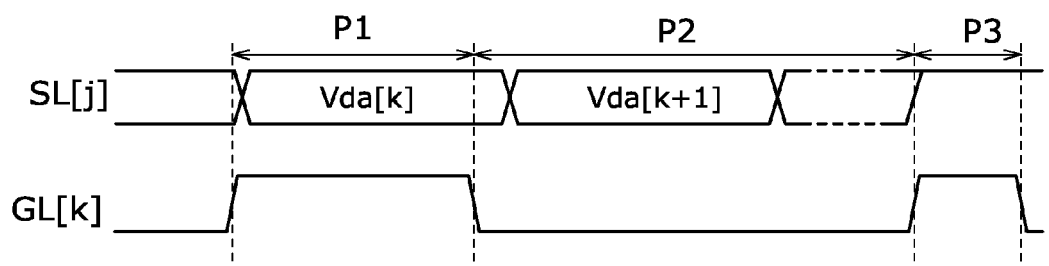
FIG. 10B is a timing chart illustrating an operation example of the pixel.

FIG. 10A is a circuit diagram showing an example of the pixel 211, and FIG. 10B is a timing chart showing an operation example of the pixel 211 in FIG. 10A.

FIG. 10A shows the pixel 211 arranged in the k-th row and the j-th column (k is an integer of 2 or more and m or less and j is an integer of 2 or more and n or less). The pixel 211 is electrically connected to wirings GL, SL, ML, and ANL. The pixel 211 includes transistors M5, M6, and M7, a capacitor C1, and a light-emitting element EL1.

The light-emitting element EL1 includes a pair of terminals (an anode and a cathode). As the light-emitting element EL1, an element which can control the luminance with current or voltage can be used. Typical examples of the light-emitting element EL1 include a light emitting diode (LED) and an organic light emitting diode (OLED). In the case where the light-emitting element EL1 is an OLED, the light-emitting element EL1 includes an electroluminescent (EL) layer. The EL layer is formed using a single layer or a plurality of layers between the anode and the cathode. The EL layer includes at least a layer containing a light-emitting substance (light-emitting layer). A light-emitting element in which the EL layer is used for light emission is referred to as an EL element in some cases. A display device in which the EL element is used in the pixel is referred to as an EL display device in some cases. In particular, a light-emitting element including an organic EL layer may be referred to as an organic EL element, and a display device including an organic EL element may be referred to as an organic EL display device (OLED). Needless to say, the light-emitting element EL1 can be an organic EL element.

Although the transistors M5 to M7 are n-channel transistors in FIG. 10A, some or all of the transistors may be p-channel transistors. The transistors M5 to M7 each include a back gate electrically connected to a gate. With such a device structure, the current drive capability of the transistors M5 to M7 can be improved. Some or all of the transistors M5 to M7 may be transistors which do not include back gates.

The transistor M5 is a pass transistor which connects a gate of the transistor M6 (a node N2) and the wiring SL. The transistor M7 is a pass transistor which connects the wiring ML and an anode of the light-emitting element EL1 (a node N1). The transistor M6 is a driving transistor and functions as a current source of current supplied to the light-emitting element EL1. In accordance with the amount of drain current of the transistor M6, the luminance of the light-emitting element EL1 is adjusted. The capacitor C1 is a storage capacitor which stores voltage between the node N1 and the node N2.

<Operation Example>

The data signal $V_{da}$ is input to the wiring SL. The voltage value of the data signal $V_{da}$ corresponds to the gray scale of the video signal. In FIG. 10B, $V_{da}[k]$ and $V_{da}[k+1]$ represent the data signals $V_{da}$ input to the k-th pixel 211 and the (k+1)-th pixel 211, respectively.

A period P1 is a writing operation period and the light-emitting element EL1 does not emit light during the period. Voltage $V_{ano}$ is applied to the wiring ANL and voltage $V_{cat}$ is applied to the cathode of the light-emitting element EL1. The wiring ML is electrically connected to a power supply line supplying voltage V0. The wiring GL is set at a high level to turn on the transistors M5 and M6. Voltage $V_{da}$ of the wiring SL is supplied to the node N2. A drain current of which the amount corresponds to that of the voltage $V_{da}$ flows in the transistor M6.

Note that the voltage $V_{ano}$, the voltage V0, and the voltage $V_{cat}$ are preferably set so as to satisfy the following formulae (b1), (b2), and (b3). In the following formulae, voltage $V_{thE}$ represents the threshold voltage of the light-emitting element EL1, and voltage $V_{th2}$ represents the threshold voltage of the transistor M6.

$$V0<V_{cat}+V_{thE} \quad (b1)$$

$$V_{ano}>V0+V_{thE} \quad (b2)$$

$$V_{ano}>V_{cat}+V_{thE}+V_{th2} \quad (b3)$$

When the formulae (b1) and (b2) are satisfied, even in the case where the transistor M7 is on in the period P1 (writing period), the drain current of the transistor M6 can be preferentially flown in the wiring ML, not in the light-emitting element EL1. When the formula (b3) is satisfied, a potential difference between the wiring ANL and the cathode of the light-emitting element EL1 is generated in a period P2 (light emission period); thus, the drain current of the transistor M6 is supplied to the light-emitting element EL1, and the light-emitting element EL1 can emit light. During the period P2, the transistors M5 and M7 are turned off.

A period P3 is a monitor period in which the drain current of the transistor M6 is obtained. The transistors M5 and M7 are turned on. Furthermore, an electrical connection between the wiring ML and the power supply line supplying the voltage V0 is broken. To the wiring SL, such a voltage that the voltage of the node N2 is higher than the voltage $V_{th2}$ is supplied. The voltage $V_{ano}$ is supplied to the wiring ANL, and the voltage $V_{cat}$ is supplied to the cathode of the light-emitting element EL1. The wiring SL and the like are driven in this manner, whereby the drain current of the transistor M6 can be preferentially flown in the wiring ML, not in the light-emitting element EL1.

The signal $I_{MON}$ output from the pixel 211 to the wiring ML in the period P3 includes the drain current flowing in the transistor M6 during the light emission period. The signal $I_{MON}$ is analyzed and the voltage $V_{da}$ of the data signal is corrected on the basis of the analyzation result, whereby the deviation of the luminance of the pixel 211 can be corrected.

The monitor operation need not necessarily performed after light-emitting operation. For example, in the pixel 211, the monitor operation can be performed after the cycle of data writing operation and light-emitting operation is repeated plural times. Alternatively, after the monitor operation, the light-emitting element EL1 may be brought into a non-light-emitting state by writing a data signal corresponding to the lowest grayscale level 0 to the pixel 211.

Although an example in which the light-emitting element is used as the display element is shown here, one embodiment of the present invention is not limited thereto. For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an EL (electroluminescence) element (e.g., an EL element including organic and inorganic materials, an organic EL element, or an inorganic EL element), an LED (e.g., a white LED, a red LED, a green LED, or a blue LED), a transistor (a transistor that emits light in response to current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, a display element including a carbon nanotube, and the like. Other than the above, display media whose contrast, luminance, reflectivity, transmittance, or the like is changed by electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. For a transflective liquid crystal display or a reflective liquid crystal display, some or all of the pixel electrodes function as reflective electrodes. For example, some or all of the pixel electrodes are formed to contain aluminum, silver, or the like. In such a case, a memory circuit such as an SRAM can be provided under the reflective electrodes, which can lower power consumption. Note that in the case where an LED is used, graphene or graphite may be provided under an electrode or a nitride semiconductor of the LED. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED can be formed. Note that an AlN layer may be provided between the n-type GaN semiconductor layer including crystals and graphene or graphite. The GaN semiconductor layers included in the LED may be formed by MOCVD. Note that when the graphene is provided, the GaN semiconductor layers included in the LED can also be formed by a sputtering method.

<<Monitor Circuit>>

Figure 11A:
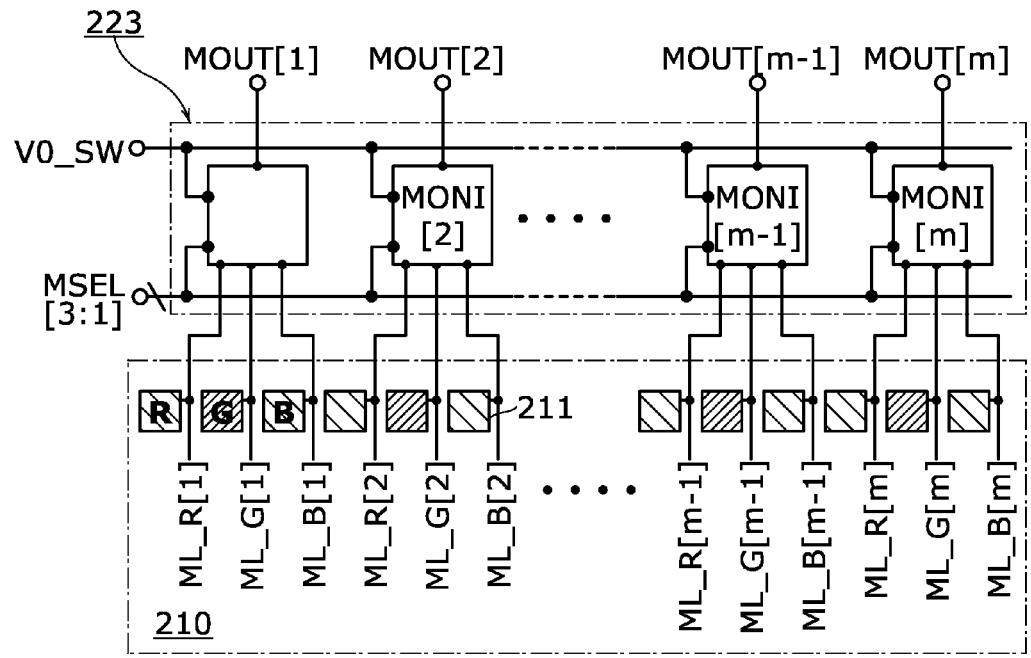
FIGS. 11A and 11B are circuit diagrams illustrating configuration examples of a monitor circuit.
Figure 11B:
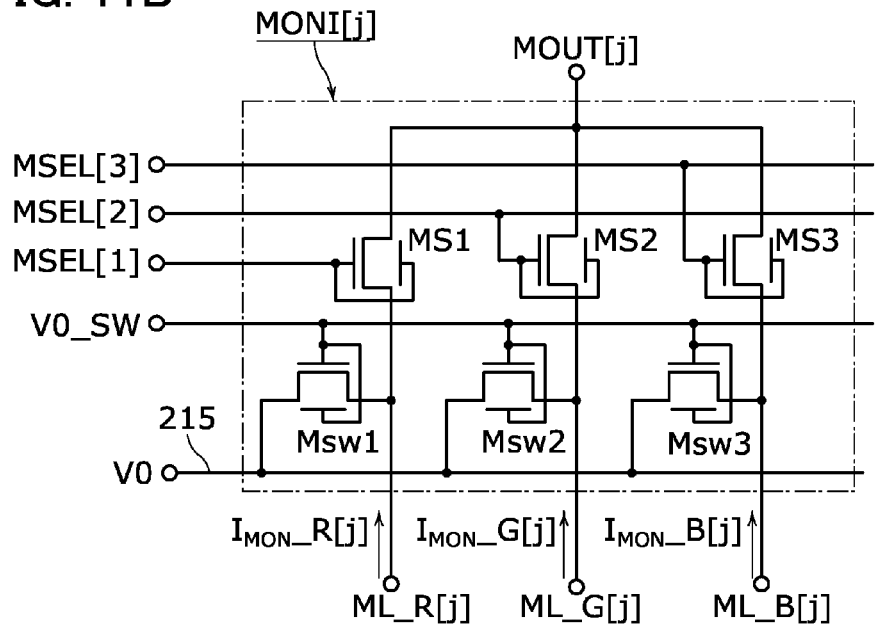

The signal $I_{MON}$ is input to the monitor circuit 223. The monitor circuit 223 is capable of controlling the output of the signal $I_{MON}$ to the ADC 224. FIG. 11A shows a configuration example of the monitor circuit 223. The monitor circuit 223 is controlled by a signal V0_SW and signals MSEL[3:1] and includes m-stage circuits MONI. FIG. 11B is a circuit diagram showing a configuration example of a circuit MONI [j]. For example, in the case where the resolution of the display panel 250 is 8k4k, the monitor circuit 223 includes 4320 circuits MONI.

The circuit MONI[j] is a three-input one-output circuit. To the input terminals of the circuit MONI, three wirings (ML_R, ML_G, and ML_B) are electrically connected, and the output terminal MOUT is electrically connected to the ADC 224. The circuit MONI[j] includes six transistors (Msw1, Msw2, Msw3, MS1, MS2, and MS3). The signal V0_SW is input to the gates of the transistors Msw1 to Msw3. The transistors Msw1, Msw2, and Msw3 have a function of switches that control the electrical connections between the power supply line 215 and the wirings ML_R, ML_G, and ML_B, respectively. The transistors MS1, MS2, and MS3 have a function of a switch that controls the electrical connection between the output terminal MOUT and the wirings ML_R, ML_G, and ML_B, respectively. The power supply line 215 is a wiring for supplying the voltage V0.

The signal V0_SW is input to the gates of the transistors Msw1 to Msw3. The signals MSEL[1], MSEL[2], and MSEL[3] are input to the gates of the transistors MS1, MS2, and MS3, respectively. During the writing period (the period P1 in FIG. 10B) and the light emission period (the period P2 in FIG. 10B), the transistors Msw1 to Msw3 are turned on and the transistors MS1 to MS3 are turned off. During the monitor period (the period P3 in FIG. 10B), the transistors Msw1 to Msw3 are turned off. Any one of the transistors MS1 to MS3 is controlled to be turned on. In the monitor period, current signals $I_{MON\_R}[j]$, $I_{MON\_G}[j]$, and $I_{MON\_B}[j]$ that flow through the wirings ML_R[j], ML_G[j], and ML_B[j], respectively, are sequentially output from the terminal MOUT[j].

Here, although the transistors Msw1 to Msw3 and MS1 to MS3 are n-channel transistors, some or all of the transistors may be p-channel transistors. Furthermore, although the transistors Msw1 to Msw3 and MS1 to MS3 each include a back gate, some or all of the transistors may be transistors which do not include back gates.

<<Display Panel>>

Figure 12:
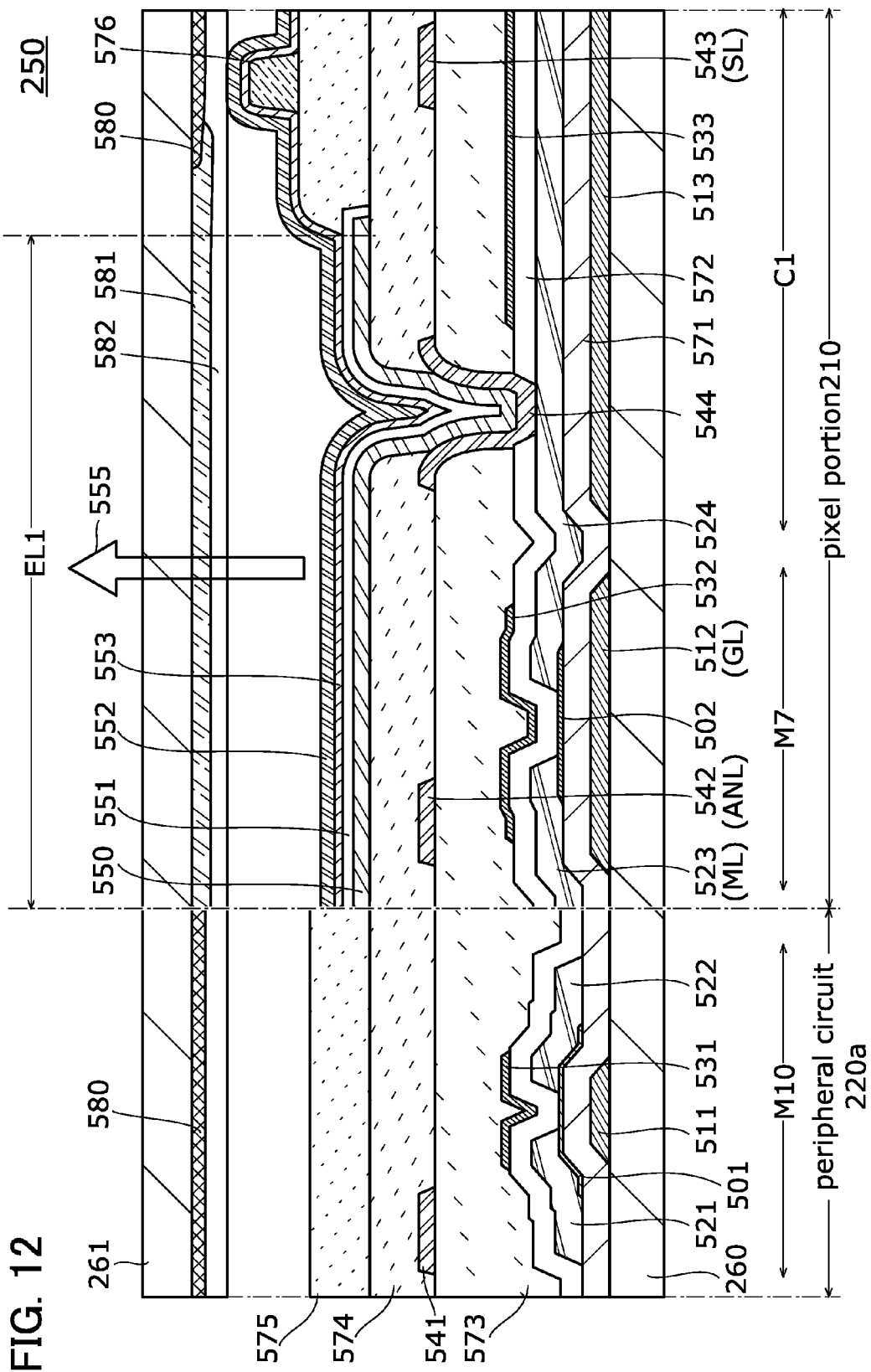
FIG. 12 is a cross-sectional view showing a structural example of a display panel.

FIG. 12 shows an example of a device structure of the display panel 250. FIG. 12 illustrates a stacked-layer structure of the display panel 250. Note that FIG. 12 is a diagram for illustrating device structures of the pixel portion 210 and a peripheral circuit 220a (the GDR, the GDL, and the monitor circuit 223 in the example of FIG. 9) formed together with the pixel portion 210, and is not a cross-sectional view of a specific portion of the display panel 250. In FIG. 12, the display panel 250 has a top-emission structure in which light 555 emitted from the light-emitting element EL1 is extracted from the substrate 261 side.

There is no particular limitation on a device structure of a transistor, a capacitor, and the like provided on the substrate 260. A device structure suitable for each function of the pixel portion 210 and the peripheral circuit 220a can be selected. As the device structure of the transistor, for example, a top-gate type, a bottom-gate type, a dual-gate type provided with both a gate (front gate) and a bottom gate, and a multi-gate type including a plurality of gate electrodes for one semiconductor layer are given. There is also no particular limitation on a semiconductor layer in which a channel of the transistor is formed. A semiconductor included in the semiconductor layer is roughly divided into a single crystal semiconductor and a non-single-crystal semiconductor. As the non-single-crystal semiconductor, a polycrystalline semiconductor, a microcrystalline semiconductor, an amorphous semiconductor, and the like are given. As a semiconductor material, a semiconductor including one kind or a plurality of kinds of elements such as Si, Ge, and C (e.g., silicon, silicon germanium, or silicon carbide), an oxide semiconductor (e.g., an In—Ga—Zn oxide or an In—Sn—Zn oxide), a compound semiconductor, and the like are given.

Here, as an example of the display panel 250, an example in which the element substrate is formed with transistors having the same conductivity type is described. In the example, the transistors of the element substrate are transistors in which channels are formed in oxide semiconductor layers (hereinafter referred to as OS transistors in some cases). FIG. 12 illustrates the transistor M7, the capacitor C1, the light-emitting element EL1, and a transistor M10 in the peripheral circuit 220a. The transistors M7 and M10 each have a dual-gate structure in which a gate electrode is provided on the substrate 260 side.

<Element Substrate>

The element substrate of the display panel 250 is formed in such a manner that an oxide semiconductor (OS) layer, a plurality of insulating layers, a plurality of conductive layers, and the like are stacked over the substrate 260.

The conductive layers of the display panel 250 can be formed with a single-layer conductive film or two or more conductive films. Such conductive films are metal films containing aluminum, chromium, copper, silver, gold, platinum, tantalum, nickel, titanium, molybdenum, tungsten, hafnium, vanadium, niobium, manganese, magnesium, zirconium, beryllium, or the like. Furthermore, an alloy film and a compound film containing these metals as components, a polycrystalline silicon film containing an impurity element such as phosphorus, a silicide film, and the like can be used. A light-transmitting conductive film may also be used as the conductive layers of the display panel 250. Examples of the light-transmitting conductive film include a film containing a metal oxide such as indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added.

The insulating layers of the display panel 250 can be formed with a single-layer insulating film or two or more insulating films. Examples of an inorganic insulating film that can be used for the insulating layers include an aluminum oxide film, a magnesium oxide film, a silicon oxide film, a silicon oxynitride film, a silicon nitride oxide film, a silicon nitride film, a gallium oxide film, a germanium oxide film, an yttrium oxide film, a zirconium oxide film, a lanthanum oxide film, a neodymium oxide film, a hafnium oxide film, and a tantalum oxide film. Examples of a resin film that can be used for the insulating layers include an organic resin film of an acrylic resin, a polyimide resin, a benzocyclobutene-based resin, a siloxane-based resin, a polyamide resin, an epoxy resin, or the like. Note that in this specification, an oxynitride refers to a substance that contains more oxygen than nitrogen, and a nitride oxide refers to a substance that contains more nitrogen than oxygen.

The element substrate of the display panel in FIG. 12 includes oxide semiconductor (OS) layers 501 and 502, conductive layers 511 to 513 provided in a first conductive layer, conductive layers 521 to 524 provided in a second conductive layer, conductive layers 531 to 533 provided in a third conductive layer, conductive layers 541 to 544 provided in a fourth conductive layer, a conductive layer 550 provided in a fifth conductive layer, a conductive layer 551 provided in a sixth conductive layer, a conductive layer 552 provided in a seventh conductive layer, an EL layer 553, and insulating layers 571 to 576. The insulating layer 571 serves as gate insulating layers of the transistors M7 and M10 and a dielectric of the capacitor C1. The insulating layer 572 serves as a dielectric of the capacitor C1. The insulating layer 576 functions as a spacer that maintains a gap between the substrate 260 and the substrate 261.

<GDR and GDL>

The transistor M10 includes the OS layer 501 and the conductive layers 511, 521, 522, and 531. The conductive layer 531 functions as a back gate and is electrically connected to the conductive layer 511. The conductive layer 541 serves as an electrode or a wiring for electrically connecting elements provided in the GDR and the GDL.

<Pixel Portion>

The transistor M7 includes the OS layer 502 and the conductive layers 512, 523, 524, and 532. The conductive layer 532 functions as a back gate and is electrically connected to the conductive layer 512. The conductive layer 512 serves as the wiring GL and the conductive layer 523 serves as the wiring ML. The conductive layer 524 is shared by the transistor M7 and the capacitor C1. In the example of FIG. 12, the conductive layer 512 can function as a light-blocking layer of the transistor M7. The entire under surface of the OS layer 502 overlaps the conductive layer 512 with the insulating layer 571 provided therebetween. The capacitor C1 is an MIM type, and includes stacked layers of the conductive layer 513, the insulating layer 571, the conductive layer 524, the insulating layer 572, and the conductive layer 533. The conductive layer 542 serves as the wiring ANL, the conductive layer 543 serves as the wiring SL, and the conductive layer 544 serves as an electrode for electrically connecting the light-emitting element EL1 to the transistor M7 and the capacitor C1.

The light-emitting element EL1 is provided over the insulating layer 574. A portion in which the conductive layers 550 to 552 and the EL layer 553 are stacked functions as the light-emitting element EL1. The conductive layers 550 and 551 serve as an anode electrode or a cathode electrode of the light-emitting element EL1. The conductive layers 550 and 551 are provided in each of the pixels 211. At least one conductive layer 552 and at least one EL layer 553 are provided in the pixel portion 210.

The EL layer 553 is formed using at least a light-emitting material in which holes and electrons can be recombined to cause light emission. In the EL layer 553, a functional layer such as a hole-injection layer, a hole-transport layer, an electron-transport layer, or an electron-injection layer may be formed as needed. Here, the EL layer 553 that emits white light is provided. The conductive layer 551 is provided in order that the light-emitting element EL1 has a microcavity structure. The conductive layer 551 can be formed using an indium tin oxide film containing silicon oxide, for example. An optical path between the conductive layer 550 and the conductive layer 552 is adjusted by the conductive layer 551. The thickness of the conductive layer 551 is adjusted in accordance with the wavelength of light extracted from the pixel 211. The thickness of the conductive layer 551 may be adjusted within the range of 5 nm to 100 nm, for example. As the wavelength of the light 555 is increased, the thickness of the conductive layer 551 is made larger. Thus, the relationship of the thicknesses of the conductive layers 551 between pixels 211_R, 211_G, and 211_B is represented by the following: the thickness in the pixel 211_R>that in the pixel 211_G>that in the pixel 211_B.

<Structural Example of Counter Substrate>

The counter substrate is fixed with a sealant (not shown) to face the substrate 260. The counter substrate of the display panel 250 in FIG. 12 includes the substrate 261, a light-blocking layer 580, a color filter layer 581, and an overcoat layer 582. The color filter layer 581 is colored a color corresponding to the pixel 211. The color filter layer 581 may be provided on the element substrate or omitted. The peripheral circuit 220a is shielded from light by the light-blocking layer 580. In the pixel portion 210, the light-blocking layer 580 is provided to shield a region that does not contribute to display from light. The overcoat layer 582 has functions of planarizing the surface of the counter substrate and preventing diffusion of impurities (such as water and/or oxygen). The overcoat layer 582 can be formed using, for example, a polyimide resin, an epoxy resin, an acrylic resin, or the like.

<Substrate>

Examples of the substrates 260 and 261 include a glass substrate, a quartz substrate, a plastic substrate, a metal substrate, a stainless steel substrate, a substrate including stainless steel foil, a tungsten substrate, a substrate including tungsten foil, a flexible substrate, a laminate film, paper including a fibrous material, and a base film. Examples of a glass substrate include a barium borosilicate glass substrate, an aluminoborosilicate glass substrate, and a soda lime glass substrate. Examples of a flexible substrate include a flexible synthetic resin such as plastics typified by polyethylene terephthalate (PET), polyethylene naphthalate (PEN), and polyether sulfone (PES), and acrylic. A film made of polypropylene, polyester, polyvinyl fluoride, polyvinyl chloride, or the like, an inorganic film formed by evaporation, or the like can be used as a laminate film. Examples of a base film are base films formed using polyester, polyamide, polyimide, aramid, epoxy, an inorganic vapor deposition film, or paper. Note that in the example of FIG. 12, the substrate 261 transmits the light 555 (visible light).

The substrate 260 is not necessarily a supporting substrate (such as a glass substrate) used for manufacturing the pixel portion 210 and the peripheral circuit 220a. After the pixel portion 210 and the peripheral circuit 220a are formed or in the formation steps of the pixel portion 210 and the peripheral circuit 220a, a supporting substrate may be separated, and a flexible substrate may be attached with an adhesive layer. Furthermore, similarly, the substrate 261 is not necessarily a supporting substrate (such as a glass substrate) used for manufacturing the color filter layers 581 and the like, and after formation of the overcoat layer 582, a supporting substrate may be separated, and a flexible substrate may be attached with an adhesive layer.

When a flexible substrate is used as each of the substrates 260 and 261, a flexible display device can be obtained. Furthermore, the incorporation of the flexible display device enables the provision of a flexible semiconductor device.

(Embodiment 3)

In this embodiment, structural examples of oxide semiconductor transistors that can be used as the transistors M1 or the transistors M2 in Embodiment 1 will be described with reference to FIGS. 13A to 13C and FIGS. 14A to 14C.

<<Structural Example 1 of Oxide Semiconductor Transistor>>

Figure 13A:
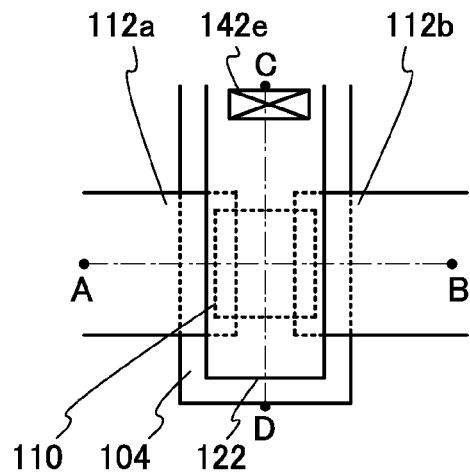
FIG. 13A is a top view and FIGS. 13B and 13C are cross-sectional views showing structural examples of a transistor.
Figure 13B:
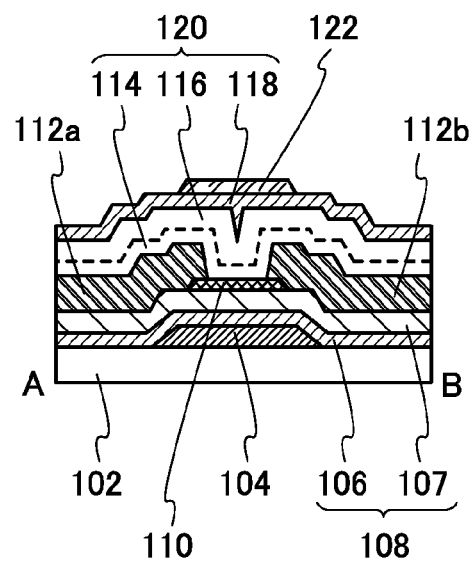
Figure 13C:
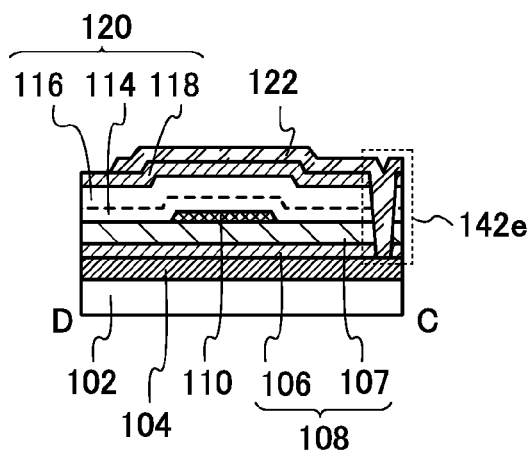

FIG. 13A to 13C are a top view and cross-sectional views of a transistor 150. FIG. 13A is a top view of the transistor 150, FIG. 13B is a cross-sectional view taken along the dashed-dotted line A-B in FIG. 13A, and FIG. 13C is a cross-sectional view taken along the dashed-dotted line C-D in FIG. 13A. Note that in FIG. 13A, some components are not shown for clarity.

The transistor 150 includes a conductive film 104 provided over a substrate 102, a first insulating film 108 that includes insulating films 106 and 107 and is formed over the substrate 102 and the conductive film 104, an oxide semiconductor film 110 overlapping with the conductive film 104 with the first insulating film 108 provided therebetween, and a conductive film 112a and a conductive film 112b in contact with the oxide semiconductor film 110.

In addition, over the first insulating film 108, the oxide semiconductor film 110, the conductive film 112a, and the conductive film 112b, a second insulating film 120 including insulating films 114, 116, and 118 and a conductive film 122 formed over the second insulating film 120 are provided.

The conductive film 122 is connected to the conductive film 104 in an opening 142e provided in the first insulating film 108 and the second insulating film 120.

In the transistor 150, the conductive film 104 has a function of a first gate electrode, and the conductive film 122 has a function of a second gate electrode. Further, the first insulating film 108 has a function of a first gate insulating film, and the second insulating film 120 has a function of a second gate insulating film.

In the transistor 150, the conductive film 112a has a function of one of a source electrode and a drain electrode, and the conductive film 112b has a function of the other of the source electrode and the drain electrode.

In the transistor 150 described in this embodiment, in the channel width direction, the oxide semiconductor film 110 between the first insulating film 108 and the second insulating film 120 is provided between the conductive film 104 and the conductive film 122. In addition, as shown in FIG. 13A, the conductive film 104 overlaps with side surfaces of the oxide semiconductor film 110 with the first insulating film 108 provided therebetween, when seen from the above.

The conductive film 104 and the conductive film 122 are connected to each other in the opening 142e. When the conductive film 104 and the conductive film 122 have the same potential, carriers flow in a wide region of the oxide semiconductor film 110. Accordingly, the amount of carriers that move in the transistor 150 increases.

As a result, the on-state current of the transistor 150 is increased, and the field-effect mobility is increased to greater than or equal to 10 cm$^2$/V·s or to greater than or equal to 20 cm$^2$/V·s, for example. Note that here, the field-effect mobility is not an approximate value of the mobility as the physical property of the oxide semiconductor film but is an index of current drive capability and the apparent field-effect mobility of a saturation region of the transistor.

An increase in the field-effect mobility becomes significant when the channel length (also referred to as L length) of the transistor is longer than or equal to 0.5 μm and shorter than or equal to 6.5 μm, preferably longer than 1 μm and shorter than 6 μm, further preferably longer than 1 μm and shorter than or equal to 4 μm, still further preferably longer than 1 μm and shorter than or equal to 3.5 μm, yet still further preferably longer than 1 μm and shorter than or equal to 2.5 μm. Furthermore, with a short channel length longer than or equal to 0.5 μm and shorter than or equal to 6.5 μm, the channel width can also be short.

The transistor 150 includes the conductive film 104 and the conductive film 122, each of which has a function of blocking an external electric field; thus, fixed charges between the substrate 102 and the conductive film 104 and over the conductive film 122 do not affect the oxide semiconductor film 110. Thus, degradation due to stress test (e.g., a negative gate bias temperature (−GBT) stress test in which a negative potential is applied to a gate electrode) can be reduced, and changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor between before and after the BT stress test is an important indicator when examining the reliability of the transistor. If the amount of change in the threshold voltage between before and after the BT stress test is small, the transistor has higher reliability.

In the transistor 150, different potentials may be supplied to the conductive films 104 and 122 which are not connected to each other. With this structure, the threshold voltage of the transistor 150 can be controlled.

Depending on the circumstances, the conductive film 122 may be omitted in the transistor 150.

The substrate 102 and individual components included in the transistor 150 will be described below.

<Substrate 102>

Examples of the substrate 102 include a glass substrate, a quartz substrate, a plastic substrate, a metal substrate, a stainless steel substrate, a substrate including stainless steel foil, a tungsten substrate, a substrate including tungsten foil, a flexible substrate, a laminate film, paper including a fibrous material, and a base film. Examples of a glass substrate include a barium borosilicate glass substrate, an aluminoborosilicate glass substrate, and a soda lime glass substrate. Examples of a flexible substrate include a flexible synthetic resin such as plastics typified by polyethylene terephthalate (PET), polyethylene naphthalate (PEN), and polyether sulfone (PES), and acrylic. A film made of polypropylene, polyester, polyvinyl fluoride, polyvinyl chloride, or the like, an inorganic film formed by evaporation, or the like can be used for a laminate film. Examples of a base film are base films formed using polyester, polyamide, polyimide, aramid, epoxy, an inorganic vapor deposition film, and paper.

The substrate 102 is not limited to a simple support, and may be a substrate where an element such as a transistor or a capacitor is formed.

<Gate Electrode>

As a material used for the conductive films 104 and 122, a metal element selected from aluminum, chromium, copper, tantalum, titanium, molybdenum, and tungsten, an alloy containing any of these metal elements as a component, an alloy containing these metal elements in combination, or the like can be used. The conductive films 104 and 122 may have a single-layer structure or a stacked-layer structure of two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used. The material for the conductive films 104 and 122 can be formed by, for example, a sputtering method.

For the conductive film used as the conductive films 104 and 122, an oxide containing indium may be used. The conductive films 104 and 122 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

<Gate Insulating Film>

An example in which the first insulating film 108 has a two-layer structure of the insulating film 106 and the insulating film 107 is illustrated. Note that the structure of the first insulating film 108 is not limited thereto, and for example, the first insulating film 108 may have a single-layer structure or a stacked-layer structure including three or more layers.

The insulating film 106 is formed to have a single-layer structure or a stacked-layer structure using, for example, any of a silicon nitride oxide film, a silicon nitride film, an aluminum oxide film, and the like with a PE-CVD apparatus. In the case where the insulating film 106 has a stacked-layer structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. As a result, hydrogen and nitrogen contained in the insulating film 106 can be inhibited from moving or diffusing into the oxide semiconductor film 110 to be formed later.

The insulating film 107 is formed to have a single-layer structure or a stacked-layer structure using any of a silicon oxide film, a silicon oxynitride film, and the like with a PE-CVD apparatus.

The insulating film 108 can have a stacked-layer structure, for example, in which a 400-nm-thick silicon nitride film used as the insulating film 106 and a 50-nm-thick silicon oxynitride film used as the insulating film 107 are formed in this order. The silicon nitride film and the silicon oxynitride film are preferably formed in succession in a vacuum such that fewer impurities are mixed into the films.

Note that silicon nitride oxide refers to an insulating material that contains more nitrogen than oxygen, whereas silicon oxynitride refers to an insulating material that contains more oxygen than nitrogen.

<Oxide Semiconductor Film>

The oxide semiconductor film 110 preferably includes a film represented by an In-M-Zn oxide that contains at least indium (In), zinc (Zn), and M (M is a metal such as Al, Ga, Ge, Y, Zr, Sn, La, Ce, or Hf). Both In and Zn are preferably contained. In order to reduce fluctuation in electrical characteristics of the transistors including the oxide semiconductor films, the oxide semiconductor film preferably contains a stabilizer in addition to indium and zinc.

As a stabilizer, gallium (Ga), tin (Sn), hafnium (Hf), aluminum (Al), zirconium (Zr), and the like can be given. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be given.

As the oxide semiconductor included in the oxide semiconductor film 110, any of the following can be used: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. The In—Ga—Zn-based oxide may contain another metal element in addition to In, Ga, and Zn.

tor film 110 can be formed by a sputtering method, a molecular beam epitaxy (MBE) method, a CVD method, a pulse laser deposition method, an atomic layer deposition (ALD) method, or the like as appropriate. In particular, the oxide semiconductor film 110 is preferably formed by the sputtering method because the oxide semiconductor film 110 can be dense.

In the formation of the oxide semiconductor film 110, the hydrogen concentration in the oxide semiconductor film is preferably reduced as much as possible. In order to reduce the hydrogen concentration, besides the high vacuum evacuation of the chamber, high purity of a sputtering gas is also needed when film formation is performed by a sputtering method, for example. As an oxygen gas or an argon gas used for a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be prevented as much as possible.

In order to remove moisture remaining in the deposition chamber, an entrapment vacuum pump, such as a cryopump, an ion pump, or a titanium sublimation pump, is preferably used. The evacuation unit may be a turbo molecular pump provided with a cold trap. When the deposition chamber is evacuated with a cryopump, which has a high capability in removing a compound including a hydrogen atom such as water ($H_2O$) (preferably a compound containing a carbon atom) and the like, the concentration of an impurity to be contained in an oxide semiconductor film formed in the deposition chamber can be reduced.

When the oxide semiconductor film as the oxide semiconductor film 110 is formed by a sputtering method, the relative density (filling factor) of a metal oxide target that is used for the film formation is greater than or equal to 90% and less than or equal to 100%, preferably greater than or equal to 95% and less than or equal to 100%. With the use of the metal oxide target having high relative density, a dense oxide film can be formed.

Note that to reduce the impurity concentration of the oxide semiconductor film, it is also effective to form the oxide semiconductor film 110 while the substrate 102 is kept at high temperature. The heating temperature of the substrate 102 may be higher than or equal to 150° C. and lower than or equal to 450° C., and preferably the substrate temperature is higher than or equal to 200° C. and lower than or equal to 350° C.

Next, heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor that is used as the oxide semiconductor film 110 can be improved, and in addition, impurities such as hydrogen and water can be removed from the first insulating film 108 and the oxide semiconductor film 110. The first heat treatment may be performed before processing the oxide semiconductor film 110 into an island shape.

Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Note that it is preferable to use, as the oxide semiconductor film 110, an oxide semiconductor film in which the impurity concentration is low and density of defect states is low, in which case the transistor can have excellent electrical characteristics. Here, the state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, the highly purified intrinsic or substantially highly purified intrinsic oxide semiconductor film has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small variation in electrical characteristics and high reliability.

<Source Electrode and Drain Electrode>

The conductive film 112a and the conductive film 112b can be formed to have a single-layer structure or a stacked-layer structure, using any of metals such as aluminum, titanium, chromium, nickel, copper, yttrium, zirconium, molybdenum, silver, tantalum, and tungsten, or an alloy containing any of these metals as its main component. In particular, one or more elements selected from aluminum, chromium, copper, tantalum, titanium, molybdenum, and tungsten are preferably included. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive film can be formed by a sputtering method, for example.

<Protective Insulating Film>

An example in which the second insulating film 120 has a three-layer structure of the insulating films 114, 116, and 118 is illustrated. Note that the structure of the second insulating film 120 is not limited thereto, and for example, the second insulating film 120 may have a single-layer structure or a stacked-layer structure including two layers or four or more layers.

For the insulating films 114 and 116, an inorganic insulating material containing oxygen can be used in order to improve the characteristics of the interface with the oxide semiconductor used for the oxide semiconductor film 110. As examples of the inorganic insulating material containing oxygen, a silicon oxide film, a silicon oxynitride film, and the like can be given. The insulating films 114 and 116 can be formed by a PE-CVD method, for example.

The thickness of the insulating film 114 can be greater than or equal to 5 nm and less than or equal to 150 nm, preferably greater than or equal to 5 nm and less than or equal to 50 nm, more preferably greater than or equal to 10 nm and less than or equal to 30 nm. The thickness of the insulating film 116 can be greater than or equal to 30 nm and less than or equal to 500 nm, preferably greater than or equal to 150 nm and less than or equal to 400 nm.

Further, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited thereto. For example, a single-layer structure of the insulating film 114, a single-layer structure of the insulating film 116, or a stacked-layer structure including three or more layers may be used.

The insulating film 118 is a film formed using a material that can prevent an external impurity, such as water, alkali metal, or alkaline earth metal, from diffusing into the oxide semiconductor film 110, and that further contains hydrogen.

For example, a silicon nitride film, a silicon nitride oxide film, or the like having a thickness of greater than or equal to 150 nm and less than or equal to 400 nm can be used as the insulating film 118. In this embodiment, a 150-nm-thick silicon nitride film is used as the insulating film 118.

The silicon nitride film is preferably formed at a high temperature to have an improved blocking property against impurities or the like; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the oxide semiconductor film 110 and the carrier concentration is increased is caused in some cases; therefore, the upper limit of the temperature is a temperature at which the phenomenon is not caused.

<<Structural Example 2 of Oxide Semiconductor Transistor>>

Figure 14A:
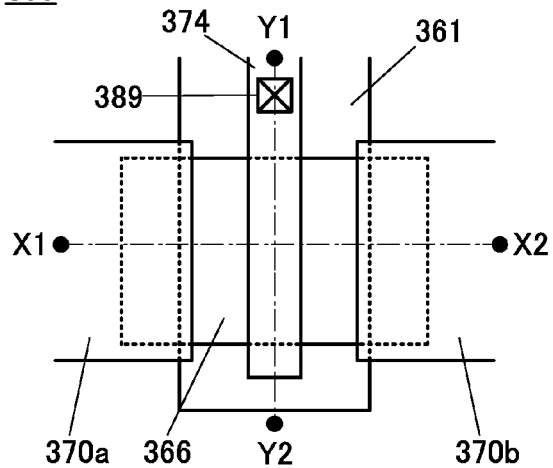
FIG. 14A is a top view and FIGS. 14B and 14C are cross-sectional views showing structural examples of a transistor.
Figure 14B:
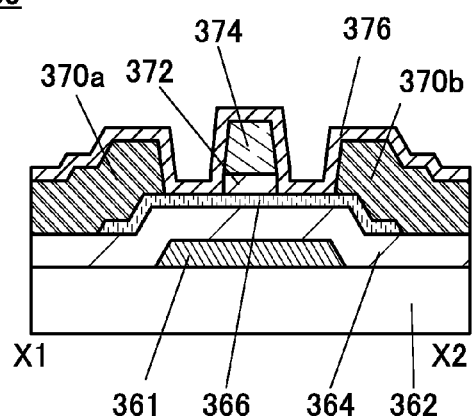
Figure 14C:
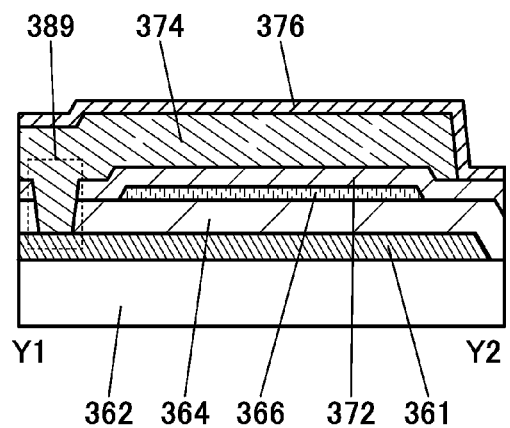

A structural example of an oxide semiconductor transistor which is different from the transistor 150 in FIGS. 13A to 13C is shown in FIGS. 14A to 14C.

FIG. 14A is a top view of the transistor 300, FIG. 14B is a cross-sectional view taken along the dashed-dotted line X1-X2 in FIG. 14A, and FIG. 14C is a cross-sectional view taken along the dashed-dotted line Y1-Y2 in FIG. 14A. FIG. 14B is a cross-sectional view in the channel length direction of the transistor 300 and FIG. 14C is a cross-sectional view in the channel width direction of the transistor 300. Note that in FIG. 14A, some components are not shown for clarity.

The transistor 300 includes a conductive film 361 over a substrate 362, an insulating film 364 over the substrate 362 and the conductive film 361, an oxide semiconductor film 366 over the insulating film 364, a conductive film 370a, a conductive film 370b, and an insulating film 372 which are in contact with the oxide semiconductor film 366, and a conductive film 374 overlapping with the oxide semiconductor film 366 with the insulating film 372 provided therebetween. An insulating film 376 is provided over the transistor 300.

In the transistor 300, the conductive film 374 has a function of a first gate electrode, and the conductive film 361 has a function of a second gate electrode. Further, the insulating film 372 has a function of a first gate insulating film, and the insulating film 364 has a function of a second gate insulating film.

In the transistor 300, the conductive film 370a has a function of one of a source electrode and a drain electrode, and the conductive film 370b has a function of the other of the source electrode and the drain electrode.

As shown in FIG. 14C, the conductive film 374 is connected to the conductive film 361 through an opening 389 in the insulating films 372 and 364. As with the transistor 150, the same potential is applied to the first gate electrode and the second gate electrode of the transistor 300; thus, the increase in on-state current can be suppressed, variations in the initial characteristics can be reduced, and degradation of the transistor due to the −GBT stress test and a change in the rising voltage of the on-state current at different drain voltages can be suppressed.

In the transistor 300, different potentials may be applied to the conductive films 374 and 361 which are not connected to each other. With this structure, the threshold voltage of the transistor 300 can be controlled.

Depending on the circumstances, the conductive film 361 may be omitted.

Regions of the oxide semiconductor film 366 not overlapping with the conductive films 370a, 370b, and 374 contain an element forming an oxygen vacancy. Hereinafter, the elements which form oxygen vacancies are described as impurity elements. Typical examples of the impurity elements include hydrogen, and rare gas elements. Typical examples of rare gas elements include helium, neon, argon, krypton, and xenon. In addition, boron, carbon, nitrogen, fluorine, aluminum, silicon, phosphorus, chlorine, and the like may be contained in the oxide semiconductor film 366.

In addition, the insulating film 376 is a film containing hydrogen and is typically a nitride insulating film. Since the insulating film 376 is in contact with the oxide semiconductor film 366, the hydrogen contained in the insulating film 376 is diffused into the oxide semiconductor film 366. As a result, regions of the oxide semiconductor film 366 in contact with the insulating film 376 contain much hydrogen.

When a rare gas element is added as an impurity element to the oxide semiconductor film, a bond between a metal element and oxygen in the oxide semiconductor film is cut, whereby an oxygen vacancy is formed. By interaction between hydrogen and the oxygen vacancy included in the oxide semiconductor film, the conductivity of the oxide semiconductor film is increased. Specifically, hydrogen enters into the oxygen vacancies in the oxide semiconductor film, whereby an electron serving as a carrier is produced. As a result, the conductivity is increased.

For the details of the substrate 362, the description of the substrate 102 in FIGS. 13B and 13C is referred to.

For the details of the conductive films 361 and 374, the description of the conductive films 104 and 122 in FIGS. 13A to 13C is referred to.

For the details of the conductive films 370a and 370b, the description of the conductive films 112a and 112b in FIGS. 13A and 13B is referred to.

For the details of the oxide semiconductor film 366, the description of the oxide semiconductor film 110 in FIGS. 13A to 13C is referred to.

The insulating film 364 can be formed to have a single-layer structure or a stacked-layer structure using one or more of an oxide insulating film and a nitride insulating film. Note that an oxide insulating film is preferably used for at least a region of the insulating film 364, which is in contact with the oxide semiconductor film 366, in order to improve characteristics of the interface with the oxide semiconductor film 366. In the case where an oxide insulating film from which oxygen is released by heating is used as the insulating film 364, oxygen contained in the insulating film 364 can be transferred to the oxide semiconductor film 366 by heat treatment.

The thickness of the insulating film 364 is greater than or equal to 50 nm, greater than or equal to 100 nm and less than or equal to 3000 nm, or greater than or equal to 200 nm and less than or equal to 1000 nm. With the use of the thick insulating film 364, the amount of oxygen released from the insulating film 364 can be increased, and the interface state density at the interface between the insulating film 364 and the oxide semiconductor film 366 and oxygen vacancies included in a channel region of the oxide semiconductor film 366 can be reduced.

The insulating film 364 can be formed to have a single-layer structure or a stacked-layer structure using, for example, a silicon oxide film, a silicon oxynitride film, a silicon nitride oxide film, a silicon nitride film, an aluminum oxide film, a hafnium oxide film, and a gallium oxide film.

The insulating film 372 can be formed to have a single-layer structure of a stacked-layer structure using an oxide insulating film or a nitride insulating film. Note that in order to improve the characteristics of the interface between the insulating film 372 and the oxide semiconductor film 366, a region of the insulating film 372 which is in contact with at least the oxide semiconductor film 366 preferably includes an oxide insulating film. The insulating film 372 can be formed to have a single-layer structure or a stacked-layer structure using, for example, one or more of a silicon oxide film, a silicon oxynitride film, a silicon nitride oxide film, a silicon nitride film, an aluminum oxide film, a hafnium oxide film, and a gallium oxide film.

It is possible to prevent outward diffusion of oxygen from the oxide semiconductor film 366 and entry of hydrogen, water, or the like into the oxide semiconductor film 366 from the outside by providing an insulating film having a blocking effect against oxygen, hydrogen, water, and the like as the insulating film 372. As the insulating film which has an effect of blocking oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating film 372 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage of the transistor can be reduced.

An oxide insulating film that releases oxygen by being heated is preferably used as the insulating film 372, in which case oxygen contained in the insulating film 372 can be moved to the oxide semiconductor film 366 by heat treatment.

The thickness of the insulating film 372 can be greater than or equal to 5 nm and less than or equal to 400 nm, greater than or equal to 5 nm and less than or equal to 300 nm, or greater than or equal to 10 nm and less than or equal to 250 nm.

(Embodiment 4)

In this embodiment, a display device and a semiconductor device that includes a display device will be described.

An electronic device or a lighting device that incorporates a flexible display device can have high reliability and can be resistant to repeated bending.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like. Flexible electronic devices can be embedded in an inside/outside wall of a house or building or an interior/exterior of a car along the curved surfaces. FIGS. 15A to 15F are structural examples of the electronic devices.

The display device of Embodiment 2, for example, can be embedded in display portions of the electronic devices shown in FIGS. 15A to 15F.

Figure 15A:
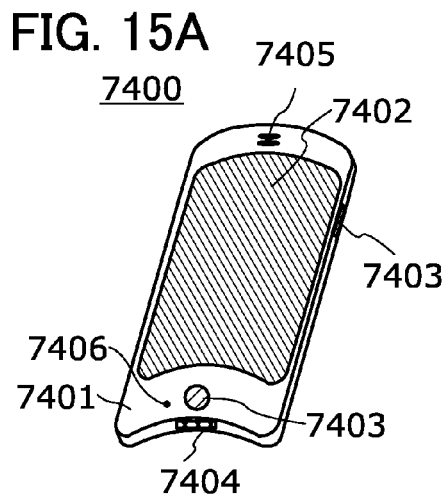
FIGS. 15A to 15F show structural examples of an electronic device.

A mobile phone 7400 shown in FIG. 15A includes a display portion 7402 incorporated in a housing 7401, operation buttons 7403, an external connection port 7404, a speaker 7405, a microphone 7406, and the like. Note that the input/output device of one embodiment of the present invention is used for the display portion 7402 of the mobile phone 7400. In accordance with one embodiment of the present invention, a highly reliable mobile phone having a curved display portion can be provided at a high yield. When the display portion 7402 of the mobile phone 7400 is touched with a finger or the like, data can be input to the mobile phone 7400. Further, operations such as making a call and inputting a letter can be performed by touch on the display portion 7402 with a finger or the like. With the operation buttons 7403, power ON or OFF can be switched. In addition, types of images displayed on the display portion 7402 can be switched; switching images from a mail creation screen to a main menu screen, for example.

Figure 15B:
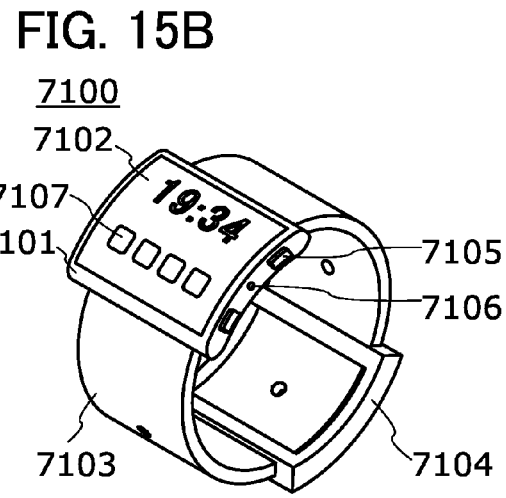

FIG. 15B shows an example of a wrist-watch-type portable information terminal. A portable information terminal 7100 shown in FIG. 15B includes a housing 7101, a display portion 7102, a band 7103, a buckle 7104, an operation button 7105, an input/output terminal 7106, and the like. The portable information terminal 7100 is capable of executing a variety of applications such as mobile phone calls, e-mailing, reading and editing texts, music reproduction, Internet communication, and a computer game. The display surface of the display portion 7102 is curved, and images can be displayed on the curved display surface. Furthermore, the display portion 7102 includes a touch sensor, and operation can be performed by touching the screen with a finger, a stylus, or the like. For example, by touching an icon 7107 displayed on the display portion 7102, an application can be started.

With the operation button 7105, a variety of functions such as time setting, power on/off, on/off control of wireless communication, setting and cancellation of silent mode, and setting and cancellation of power saving mode can be performed Te functions of the operation button 7105 can be set freely by the operating system incorporated in the portable information terminal 7100, for example. The portable information terminal 7100 can employ near field communication, which is a communication method based on an existing communication standard. In that case, for example, mutual communication between the portable information terminal 7100 and a headset capable of wireless communication can be performed, and thus hands-free calling is possible. Moreover, the portable information terminal 7100 includes the input/output terminal 7106, and data can be directly transmitted to and received from another information terminal via a connector. Charging through the input/output terminal 7106 is possible. Note that the charging operation may be performed by wireless power feeding without using the input/output terminal 7106.

Figure 15C:
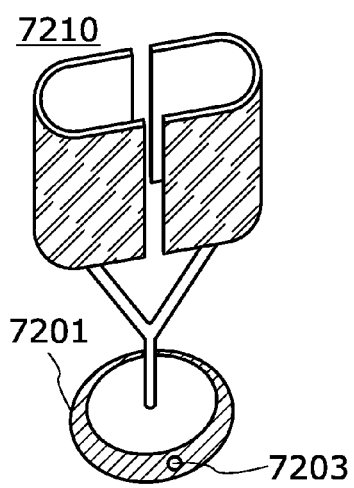

The display panel of Embodiment 2 can serve as a flat light source. In that case, the display panel is appropriately referred to as a light-emitting panel or a light source panel. An example of an electronic device provided with the light-emitting panel as a light source is shown in FIG. 15C. A lighting device 7210 includes a stage 7201 provided with an operation switch 7203 and a light-emitting portion supported by the stage 7201. A display panel is incorporated in the light-emitting portion. The light-emitting portion may be fixed on a plastic member, a movable frame, or the like so that an emission surface of the light-emitting portion can be bent freely depending on the intended use. Although the lighting device in which the light-emitting portion is supported by the stage is shown as an example in FIG. 15C, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

Figure 15D:
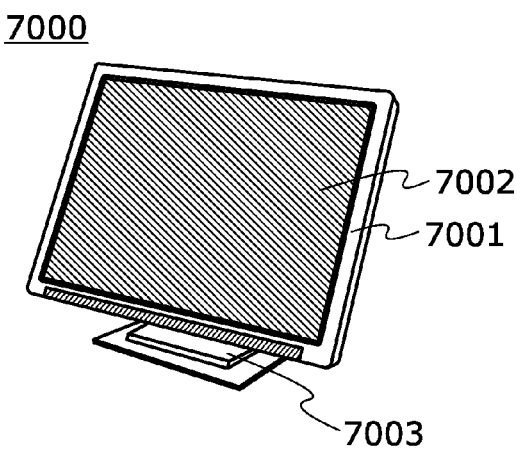

An electronic device and a lighting device in which one embodiment of the present invention is used are not limited to those having flexibility. FIG. 15D shows an example of such an electronic device. A display device 7000 in FIG. 15D includes a housing 7001, a display portion 7002, a support base 7003, and the like.

Figures 15E, 15F:
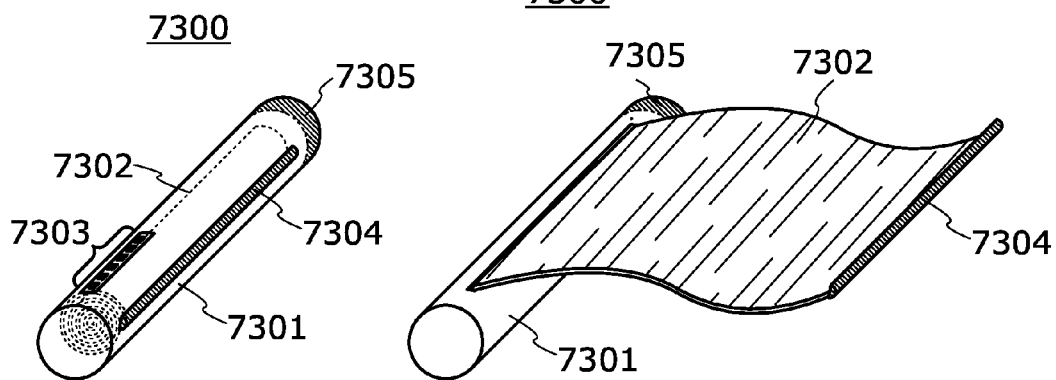

FIGS. 15E and 15F illustrate an example of a portable touch panel. A touch panel 7300 includes a housing 7301, a display portion 7302, operation buttons 7303, a display portion pull 7304, and a control portion 7305. The touch panel 7300 includes a rolled flexible display portion 7102 in the cylindrical housing 7301. The touch panel 7300 can receive a video signal with the control portion 7305 and can display the received video on the display portion 7302. In addition, a battery is included in the control portion 7305. Moreover, a terminal portion for connecting a connector may be included in the control portion 7305 so that a video signal or power can be directly supplied from the outside with a wiring. By pressing the operation buttons 7303, turning power on/off, switching of displayed videos, and the like can be performed.

FIG. 15F shows the touch panel 7300 in a state where the display portion 7302 is pulled out with the display portion pull 7304. Videos can be displayed on the display portion 7302 in this state. Further, the operation buttons 7303 on the surface of the housing 7301 allow one-handed operation. The operation buttons 7303 are provided not in the center of the housing 7301 but on one side of the housing 7301 as shown in FIG. 15E, which makes one-handed operation easy. Note that a reinforcement frame may be provided for a side portion of the display portion 7302 so that the display portion 7302 has a flat display surface when pulled out. Further, a speaker may be incorporated in the housing 7301 so that sound is output with an audio signal received together with a video signal.

Figure 16A:
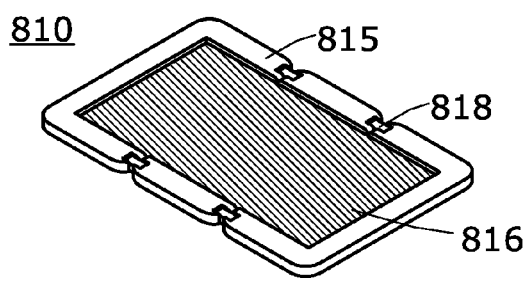
FIGS. 16A to 16I show structural examples of an electronic device.
Figure 16B:
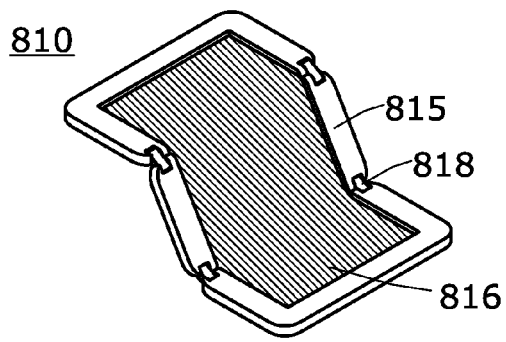
Figure 16C:
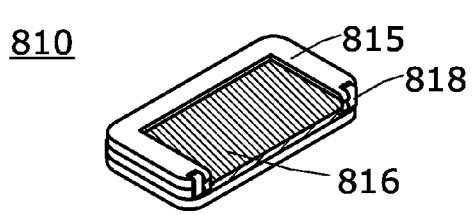

FIGS. 16A to 16C illustrate an example of a foldable portable information terminal 810. FIG. 16A shows the portable information terminal 810 that is opened. FIG. 16B shows the portable information terminal 810 that is being opened or being folded. FIG. 16C shows the portable information terminal 810 that is folded. The portable information terminal 810 is highly portable when folded. When the portable information terminal 810 is opened, a seamless large display region is highly browsable.

A display panel 816 is supported by three housings 815 joined together by hinges 818. By folding the portable information terminal 810 at a connection portion between two housings 815 with the hinges 818, the portable information terminal 810 can be reversibly changed in shape from an opened state to a folded state. For example, a display panel with a touch panel that can be bent with a radius of curvature of greater than or equal to 1 mm and less than or equal to 150 mm can be used. Note that in one embodiment of the present invention, a sensor that senses whether the display panel is in a folded state or an opened state and supplies sensor data may be used. The operation of a folded portion (or a portion that becomes invisible by a user by folding) of the display panel may be controlled to stop through the acquisition of data indicating the folded state of the display panel. Specifically, display of the portion may be stopped, and furthermore, sensing by the touch sensor may be stopped. In addition, the display or sensing by the touch sensor may be controlled to resume through the acquisition of data indicating the opened state of the display panel.

Figure 16D:
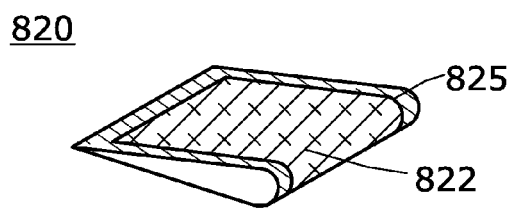
Figure 16E:
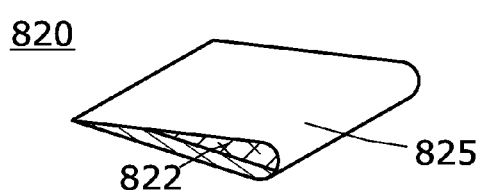

FIGS. 16D and 16E illustrate a foldable portable information terminal 820. FIG. 16D illustrates the portable information terminal 820 that is folded so that a display portion 822 is on the outside. FIG. 16E illustrates the portable information terminal 820 that is folded so that the display portion 822 is on the inside. When the portable information terminal 820 is not used, the portable information terminal 820 is folded so that a non-display portion 825 faces the outside, whereby the display portion 822 can be prevented from being contaminated or damaged. The input/output device in one embodiment of the present invention can be used for the display portion 822.

Figure 16F:
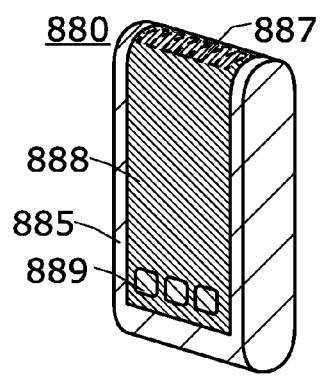
Figure 16G:
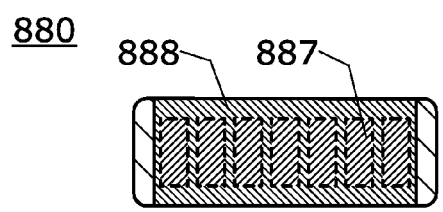
Figure 16H:
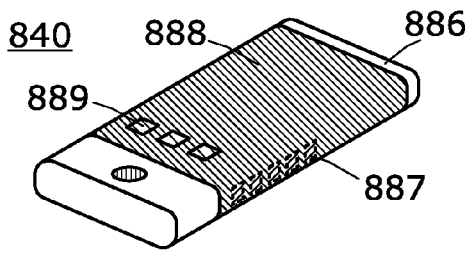

FIG. 16F is a perspective view illustrating an external shape of a portable information terminal 880. FIG. 16G is a top view of the portable information terminal 880. FIG. 16H is a perspective view illustrating an external shape of a portable information terminal 840.

The portable information terminals 880 and 840 each function as, for example, one or more of a telephone set, a notebook, and an information browsing system. Specifically, the portable information terminals 880 and 840 each can be used as a smartphone. The portable information terminals 880 and 840 can display characters and image data on its plurality of surfaces. For example, three operation buttons 889 can be displayed on one surface (FIGS. 16F and 16H). In addition, data 887 indicated by dashed rectangles can be displayed on another surface (FIGS. 16G and 16H). Examples of the data 887 include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation buttons 889, an icon, or the like may be displayed in place of the data 887.

Figure 16I:
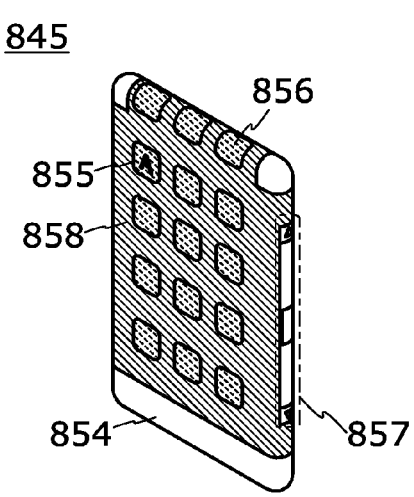

Although FIGS. 16F and 16G show an example in which the data 887 is displayed at the top, one embodiment of the present invention is not limited thereto. The information may be displayed, for example, on the side as in the portable information terminal 840 in FIG. 16H. For example, a user of the portable information terminal 880 can see the display (here, the data 887) with the portable information terminal 880 put in a breast pocket of his/her clothes. Specifically, a caller's phone number, name, or the like of an incoming call is displayed in a position that can be seen from above the portable information terminal 880. Thus, the user can see the display without taking out the portable information terminal 880 from the pocket and decide whether to answer the call. As in a portable information terminal 845 shown in FIG. 16I, information may be displayed on three or more surfaces. Here, data 855, data 856, and data 857 are displayed on different surfaces.

(Embodiment 5)

In this embodiment, the crystal structure of an oxide semiconductor film that can be used for one embodiment of the present invention will be described.

In this specification, the term "parallel" indicates that the angle formed between two straight lines is greater than or equal to −10° and less than or equal to 10°, and accordingly also includes the case where the angle is greater than or equal to −5° and less than or equal to 5°. The term "substantially parallel" indicates that the angle formed between two straight lines is greater than or equal to −30° and less than or equal to 30°. In addition, the term "perpendicular" indicates that the angle formed between two straight lines is greater than or equal to 80° and less than or equal to 100° and accordingly also includes the case where the angle is greater than or equal to 85° and less than or equal to 95°. The term "substantially perpendicular" indicates that the angle formed between two straight lines is greater than or equal to 60° and less than or equal to 120°.

In this specification, trigonal and rhombohedral crystal systems are included in a hexagonal crystal system.

Hereinafter, the structure of an oxide semiconductor film will be described.

An oxide semiconductor film is classified into a non-single-crystal oxide semiconductor film and a single crystal oxide semiconductor film. Alternatively, an oxide semiconductor is classified into, for example, a crystalline oxide semiconductor and an amorphous oxide semiconductor.

Examples of a non-single-crystal oxide semiconductor include a c-axis aligned crystalline oxide semiconductor (CAAC-OS), a polycrystalline oxide semiconductor, a microcrystalline oxide semiconductor, and an amorphous oxide semiconductor. In addition, examples of a crystalline oxide semiconductor include a single crystal oxide semiconductor, a CAAC-OS, a polycrystalline oxide semiconductor, and a microcrystalline oxide semiconductor.

First, a CAAC-OS film will be described.

The CAAC-OS film is one of oxide semiconductor films having a plurality of c-axis aligned crystal parts.

With a transmission electron microscope (TEM), a combined analysis image (also referred to as a high-resolution TEM image) of a bright-field image and a diffraction pattern of the CAAC-OS film is observed. Consequently, a plurality of crystal parts are observed. However, in the high-resolution TEM image, a boundary between crystal parts, that is, a grain boundary is not clearly observed. Thus, in the CAAC-OS film, a reduction in electron mobility due to the grain boundary is less likely to occur.

According to the high-resolution cross-sectional TEM image of the CAAC-OS film observed in a direction substantially parallel to a sample surface, metal atoms are arranged in a layered manner in the crystal parts. Each metal atom layer has a form that reflects unevenness of a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

According to the high-resolution plan-view TEM image of the CAAC-OS film observed in a direction substantially perpendicular to the sample surface, metal atoms are arranged in a triangular or hexagonal configuration in the crystal parts. However, there is no regularity of arrangement of metal atoms between different crystal parts.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Furthermore, a heavy metal such as iron or nickel, argon, carbon dioxide, or the like has a large atomic radius (or molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a microcrystalline oxide semiconductor film will be described.

A microcrystalline oxide semiconductor film has a region where a crystal part is observed in a high resolution TEM image and a region where a crystal part is not clearly observed in a high resolution TEM image. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In a high resolution TEM image of the nc-OS film, for example, a grain boundary cannot be found clearly in the nc-OS film sometimes.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak which shows a crystal plane does not appear. Furthermore, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots is shown in a ring-like region in some cases.

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Next, an amorphous oxide semiconductor film will be described.

The amorphous oxide semiconductor film has disordered atomic arrangement and no crystal part. For example, the amorphous oxide semiconductor film does not have a specific state as in quartz.

In the high-resolution TEM image of the amorphous oxide semiconductor film, crystal parts cannot be found.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Furthermore, a halo pattern is shown but a spot is not shown in a nanobeam electron diffraction pattern of the amorphous oxide semiconductor film.

Note that an oxide semiconductor film may have a structure having physical properties between the nc-OS film and the amorphous oxide semiconductor film. The oxide semiconductor film having such a structure is specifically referred to as an amorphous-like oxide semiconductor (a-like OS) film.

In a high-resolution TEM image of the a-like OS film, a void may be seen. Furthermore, in the high-resolution TEM image, there are a region where a crystal part is clearly observed and a region where a crystal part is not observed. In the a-like OS film, crystallization by a slight amount of electron beam used for TEM observation occurs and growth of the crystal part is found sometimes. In contrast, crystallization by a slight amount of electron beam used for TEM observation is hardly observed in the nc-OS film having good quality.

Note that the crystal part size in the a-like OS film and the nc-OS film can be measured using high-resolution TEM images. For example, an $InGaZnO_4$ crystal has a layered structure in which two Ga—Zn—O layers are included between In—O layers. A unit cell of the $InGaZnO_4$ crystal has a structure in which nine layers, including three In—O layers and six Ga—Zn—O layers, are layered in the c-axis direction. Accordingly, the spacing between these adjacent layers is equivalent to the lattice spacing on the (009) plane (also referred to as d value). The value is calculated to be 0.29 nm from crystal structure analysis. Thus, focusing on lattice fringes in the high-resolution TEM image, each of lattice fringes in which the lattice spacing therebetween is greater than or equal to 0.28 nm and less than or equal to 0.30 nm corresponds to the a-b plane of the $InGaZnO_4$ crystal.

The density of an oxide semiconductor film might vary depending on its structure. For example, if the composition of an oxide semiconductor film is determined, the structure of the oxide semiconductor film can be estimated from a comparison between the density of the oxide semiconductor film and the density of a single crystal oxide semiconductor film having the same composition as the oxide semiconductor film. For example, the density of the a-like OS film is higher than or equal to 78.6% and lower than 92.3% of the density of the single crystal oxide semiconductor film having the same composition. For example, the density of each of the nc-OS film and the CAAC-OS film is higher than or equal to 92.3% and lower than 100% of the density of the single crystal oxide semiconductor film having the same composition. Note that it is difficult to deposit an oxide semiconductor film whose density is lower than 78% of the density of the single crystal oxide semiconductor film.

Specific examples of the above description will be given. For example, in the case of an oxide semiconductor film with an atomic ratio of In:Ga:Zn=1:1:1, the density of single-crystal $InGaZnO_4$ with a rhombohedral crystal structure is 6.357 $g/cm^3$. Thus, for example, in the case of the oxide semiconductor film with an atomic ratio of In:Ga:Zn=1:1:1, the density of an a-like OS film is higher than or equal to 5.0 $g/cm^3$ and lower than 5.9 $g/cm^3$. In addition, for example, in the case of the oxide semiconductor film with an atomic ratio of In:Ga:Zn=1:1:1, the density of an nc-OS film or a CAAC-OS film is higher than or equal to 5.9 $g/cm^3$ and lower than 6.3 $g/cm^3$.

Note that single crystals with the same composition do not exist in some cases. In such a case, by combining single crystals with different compositions at a given proportion, it is possible to calculate density that corresponds to the density of a single crystal with a desired composition. The density of the single crystal with a desired composition may be calculated using weighted average with respect to the combination ratio of the single crystals with different compositions. Note that it is preferable to combine as few kinds of single crystals as possible for density calculation.

Note that an oxide semiconductor film may be a stacked film including two or more films of an amorphous oxide semiconductor film, an a-like OS film, a microcrystalline oxide semiconductor film, and a CAAC-OS film, for example.

This application is based on Japanese Patent Application serial no. 2014-196896 filed with Japan Patent Office on Sep. 26, 2014, the entire contents of which are hereby incorporated by reference.

What is claimed is:

1. A semiconductor device comprising:
a first circuit comprising an integrator circuit comprising an operational amplifier;
a second circuit;
a first transistor; and
a second transistor,
wherein one of a source and a drain of the first transistor is directly connected to an inverting input terminal of the operational amplifier,
wherein one of a source and a drain of the second transistor is directly connected to the inverting input terminal of the operational amplifier,
wherein a first analog signal is input to an input terminal of the integrator circuit via the first transistor,
wherein a second analog signal is input to the input terminal of the integrator circuit via the second transistor,
wherein the integrator circuit is configured to change capacitance between the inverting input terminal of the operational amplifier and an output terminal of the operational amplifier,
wherein the first circuit is configured to convert the first analog signal into a first digital signal,
wherein the second circuit is configured to generate a second digital signal based on the first digital signal,
wherein the first circuit is configured to convert the second analog signal into a third digital signal based on the second digital signal, and
wherein at least one of the first transistor and the second transistor comprises an oxide semiconductor in a channel formation region.

2. The semiconductor device according to claim 1, wherein the first circuit further comprises a comparator and a counter.

3. The semiconductor device according to claim 1, wherein the second circuit comprises a successive approximation register.

4. The semiconductor device according to claim 1,
wherein the oxide semiconductor contains indium, zinc and M, and
wherein M is Al, Ga, Ge, Y, Zr, Sn, La, Ce or Hf.

5. A semiconductor device comprising:
a first integrator circuit comprising an operational amplifier;
a comparator;
a counter;
a first transistor; and
a second transistor,
wherein one of a source and a drain of the first transistor is directly connected to an inverting input terminal of the operational amplifier,
wherein one of a source and a drain of the second transistor is directly connected to the inverting input terminal of the operational amplifier,
wherein the first transistor and the second transistor are configured not to be in an on-state at the same time,
wherein an output terminal of the operational amplifier is electrically connected to an inverting input terminal of the comparator,
wherein an output terminal of the comparator is electrically connected to the counter,
wherein the first integrator circuit is configured to change capacitance between the inverting input terminal of the operational amplifier and the output terminal of the operational amplifier, and
wherein at least one of the first transistor and the second transistor comprises an oxide semiconductor in a channel formation region.

6. The semiconductor device according to claim 5,
wherein a first analog signal is input to the inverting input terminal of the operational amplifier via the first transistor,
wherein a second analog signal is input to the inverting input terminal of the operational amplifier via the second transistor,
wherein a first potential is input to a non-inverting input terminal of the operational amplifier, and
wherein a second potential is input to a non-inverting input terminal of the comparator.

7. The semiconductor device according to claim 6, further comprising a second integrator circuit, a third transistor and a fourth transistor,
wherein the first analog signal is input to the second integrator circuit via the third transistor, and
wherein a third analog signal is input to the second integrator circuit via the fourth transistor.

8. The semiconductor device according to claim 6, wherein the capacitance is changed by using the first analog signal.

9. The semiconductor device according to claim 8, wherein the first integrator circuit is configured to integrate the second analog signal by using the capacitance changed by using the first analog signal.

10. The semiconductor device according to claim 9, further comprising a third transistor,
wherein a third analog signal is input to the inverting input terminal of the operational amplifier via the third transistor, and
wherein the first integrator circuit is configured to integrate the third analog signal by using the capacitance changed by using the first analog signal.

11. A display device comprising:
a first integrator circuit comprising an operational amplifier;
a first transistor;
a second transistor;
a pixel comprising a light-emitting element and a third transistor; and
a wiring,
wherein the light-emitting element is electrically connected to the wiring via the third transistor,
wherein one of a source and a drain of the first transistor is directly connected to an inverting input terminal of the operational amplifier,
wherein one of a source and a drain of the second transistor is directly connected to the inverting input terminal of the operational amplifier,
wherein the first transistor and the second transistor are configured not to be in an on-state at the same time,
wherein a first analog signal is input to an inverting input terminal of the operational amplifier via the first transistor,
wherein a second analog signal supplied from the wiring is input to the inverting input terminal of the operational amplifier via the second transistor,
wherein the first integrator circuit is configured to change capacitance between the inverting input terminal of the operational amplifier and an output terminal of the operational amplifier, and
wherein at least one of the first transistor and the second transistor comprises an oxide semiconductor in a channel formation region.

12. The display device according to claim 11, wherein the capacitance is changed by using the first analog signal.

13. The display device according to claim 12, wherein the first integrator circuit is configured to integrate the second analog signal by using the capacitance changed by using the first analog signal.

* * * * *